United States Patent [19]

Miller et al.

[11] Patent Number: 5,837,386
[45] Date of Patent: Nov. 17, 1998

[54] MULTILAYER FILM MATERIALS SYSTEM

[75] Inventors: Joseph Miller; Derek P. A. Pearson, both of Reading; Philip G. Pitcher, Alton, all of United Kingdom

[73] Assignee: Johnson Matthey Public Limited Company, London, United Kingdom

[21] Appl. No.: 782,242

[22] Filed: Jan. 14, 1997

Related U.S. Application Data

[63] Continuation of Ser. No. 554,926, Nov. 9, 1995, abandoned, which is a continuation of Ser. No. 304,592, Sep. 12, 1994, abandoned, which is a continuation of Ser. No. 996,685, Dec. 24, 1992, abandoned.

[30] Foreign Application Priority Data

Dec. 27, 1991 [GB] United Kingdom ................... 9127439
Apr. 13, 1992 [GB] United Kingdom ................... 9208118

[51] Int. Cl.⁶ .............................. B32B 15/04; G11B 13/04
[52] U.S. Cl. ......................... 428/623; 428/627; 428/630; 428/635; 428/641; 428/670; 428/668; 428/692; 428/694 ML
[58] Field of Search ..................................... 428/632, 670, 428/668, 672, 673, 635, 630, 641, 627, 621, 622, 623, 692, 694 ML, 620

[56] References Cited

U.S. PATENT DOCUMENTS

| | | |
|---|---|---|
| 4,395,465 | 7/1983 | Takagi et al. . |
| 4,581,245 | 4/1986 | Nakamura et al. . |
| 4,600,488 | 7/1986 | Imura et al. . |
| 4,678,721 | 7/1987 | den Broeder et al. ................. 428/635 |
| 4,711,694 | 12/1987 | Capra et al. . |
| 4,892,634 | 1/1990 | Glocker et al. . |
| 5,106,703 | 4/1992 | Carcia ..................................... 428/668 |
| 5,242,728 | 9/1993 | Mizukami ............................... 428/668 |
| 5,242,762 | 9/1993 | Kouchiyama ........................... 428/668 |
| 5,407,755 | 4/1995 | Brucker et al. ......................... 428/635 |

FOREIGN PATENT DOCUMENTS

| | | |
|---|---|---|
| 0304873 | 3/1989 | European Pat. Off. . |
| 0305666 | 3/1989 | European Pat. Off. . |
| 0320286 | 6/1989 | European Pat. Off. . |
| 0352857 | 1/1990 | European Pat. Off. . |
| 9100374 | 1/1991 | WIPO . |
| 9108578 | 6/1991 | WIPO . |
| 9114263 | 9/1991 | WIPO . |
| WO 9114263 | 9/1991 | WIPO . |

OTHER PUBLICATIONS

'Hysteresis, Microstructure, and Magneto–Optical Recording in Co/Pt and Co/Pd Multilayers', W. B. Zeper et al., J. Appl. Phys., 70 (4), 15 Aug. 1991.

'Magneto–Optical Properties in Ultrathin Co/Pd and Co/Pt Multilayered Films', Ochiai et al., Jap. J. Appl. Phys. 28, L659 (1989) (no month).

'Co/Pt and Co/Pd Ultrathin–Multilayered Films as New Magneto–Optical Recording Materials', Ochiai et al., Digest of the International Magnetics Conference, Mar. 28–31, 1989 Washington, DC, USA.

IEEE Transactions on Magnetics, vol. 25, No. 5, Sep. 1989, NY USA, pp. 3893–3895, XP69246, Nagakubo et al, "Semi–Hard Magnetism of Iron Nitride Films Prepared by Double Ion Beam Sputtering".

IBM TDB, vol. 30, No. 6, Nov. 1987, Armonk NY USA, pp. 303–305, XP111330, "Enhanced Metal–Silicide Formation by Low Energy Bombardment".

J.Appl.Phys. 70, (4), 15 Aug. 1991, pp. 2264–2271, XP 334806, Zeper et al, "Hysteresis, Microstructure and Magneto–Optical Recording in Co/Pt and Co/Pd Multilayers".

Japanese Journal of Applied Physics, vol. 28, No. 4, Apr. 1989, pp. L659–L660, Ochiai et al, "Magneto–Optical Properties in Ultrathin Co/Pd and Co/Pt Multilayer Films".

*Primary Examiner*—Ngoc-Yen Nguyen
*Attorney, Agent, or Firm*—Watson Cole Stevens Davis, P.L.L.C.

[57] ABSTRACT

Pt/Co multilayer systems having a thin metal interlayer possess superior room temperature coercivity, a square polar Kerr hysteresis loop, sufficient polar Kerr rotation, and are suitable for magneto-optical recording. These materials systems allow the reading and writing of information from the substrate side of the multilayer film.

12 Claims, 23 Drawing Sheets

MAX_KERR = .301°
COERCIVITY = 5.06 kOe

POLAR KERR LOOP THROUGH SUBSTRATE

COERCIVITY = 5.07 kOe

MAX_KERR = .285°
COERCIVITY = 4.78 kOe

POLAR KERR LOOP THROUGH SUBSTRATE

COERCIVITY = 4.86 kOe

MAX_KERR = .279°
COERCIVITY = 2.59 kOe

MAX_KERR = .225°
COERCIVITY = 3.23 kOe

MAX_KERR = .168°
COERCIVITY = 2.28 kOe

MAX_KERR = .0709°
COERCIVITY = 1.67 kOe

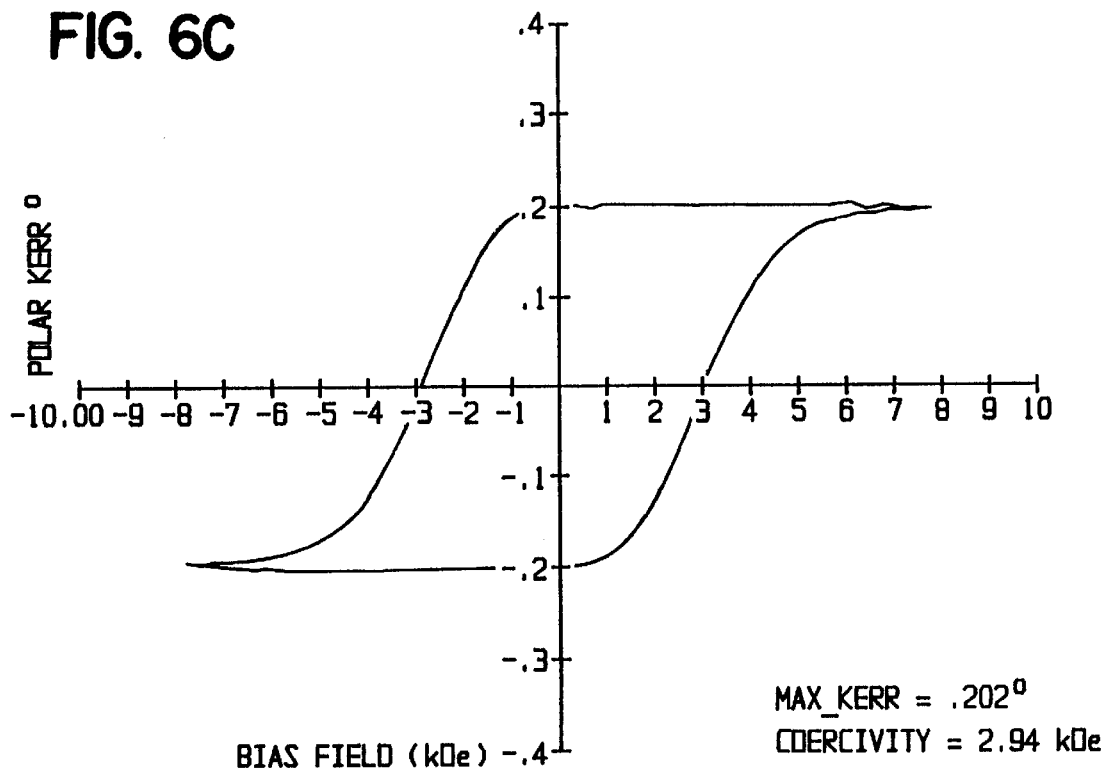
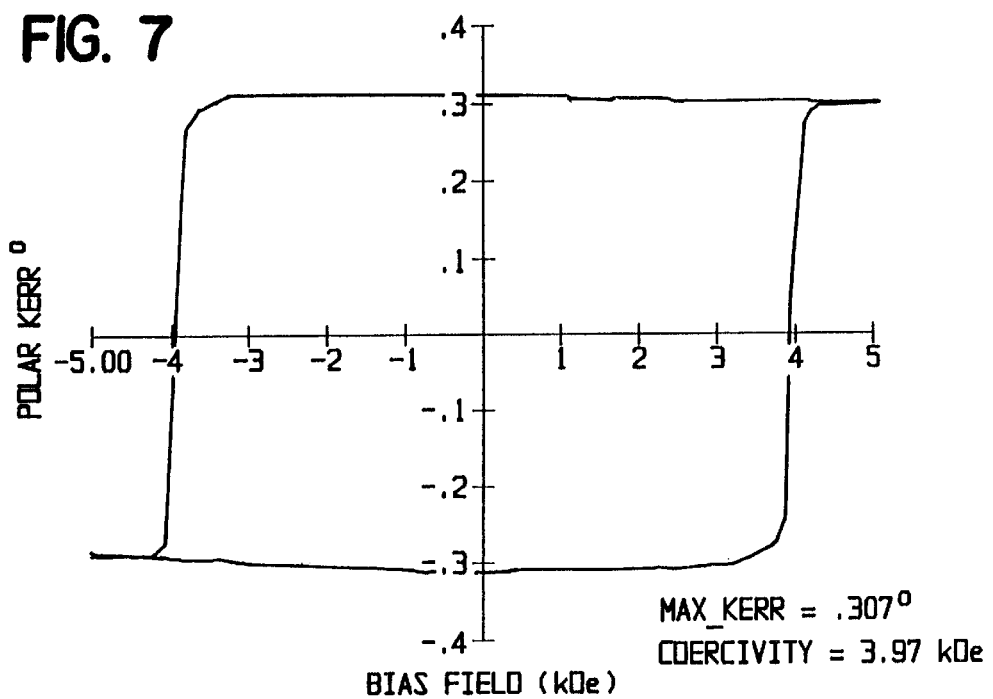

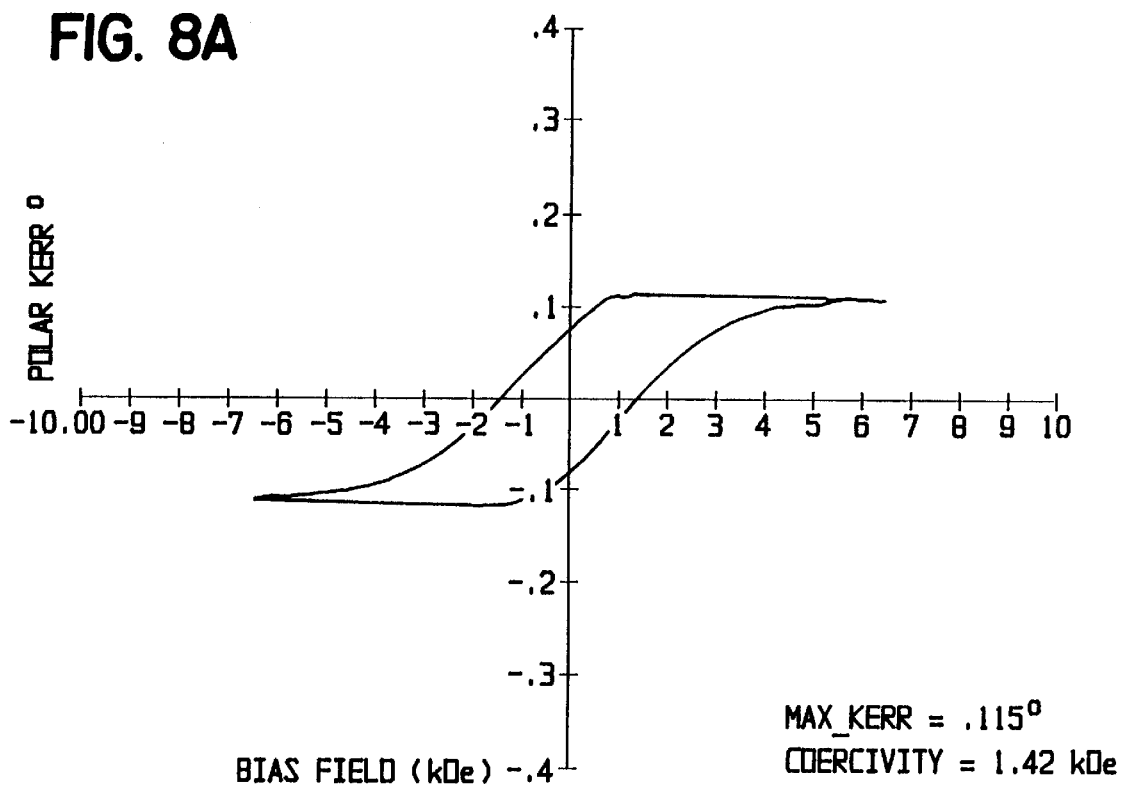
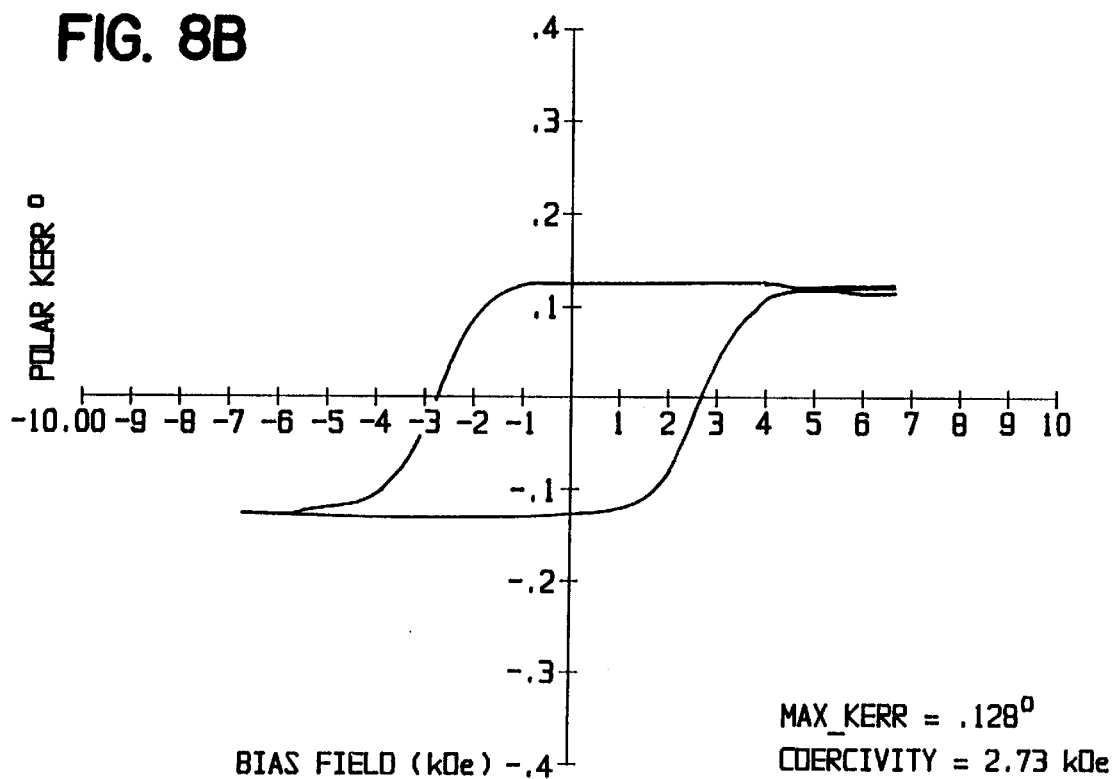

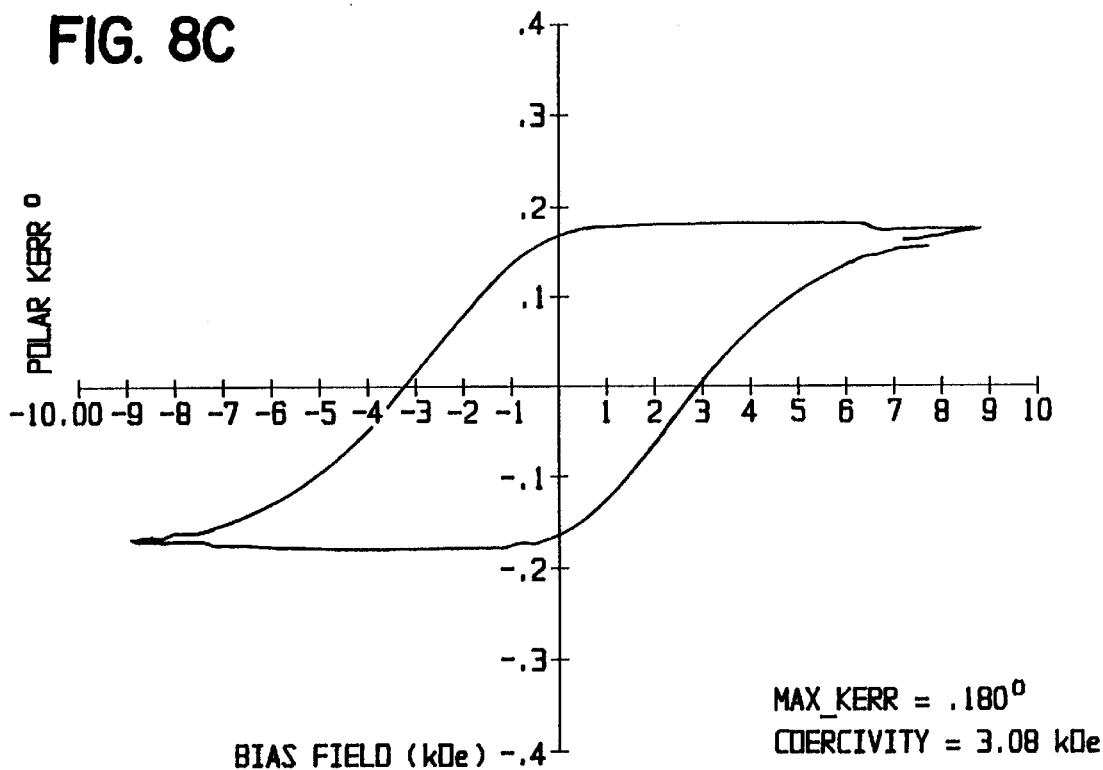
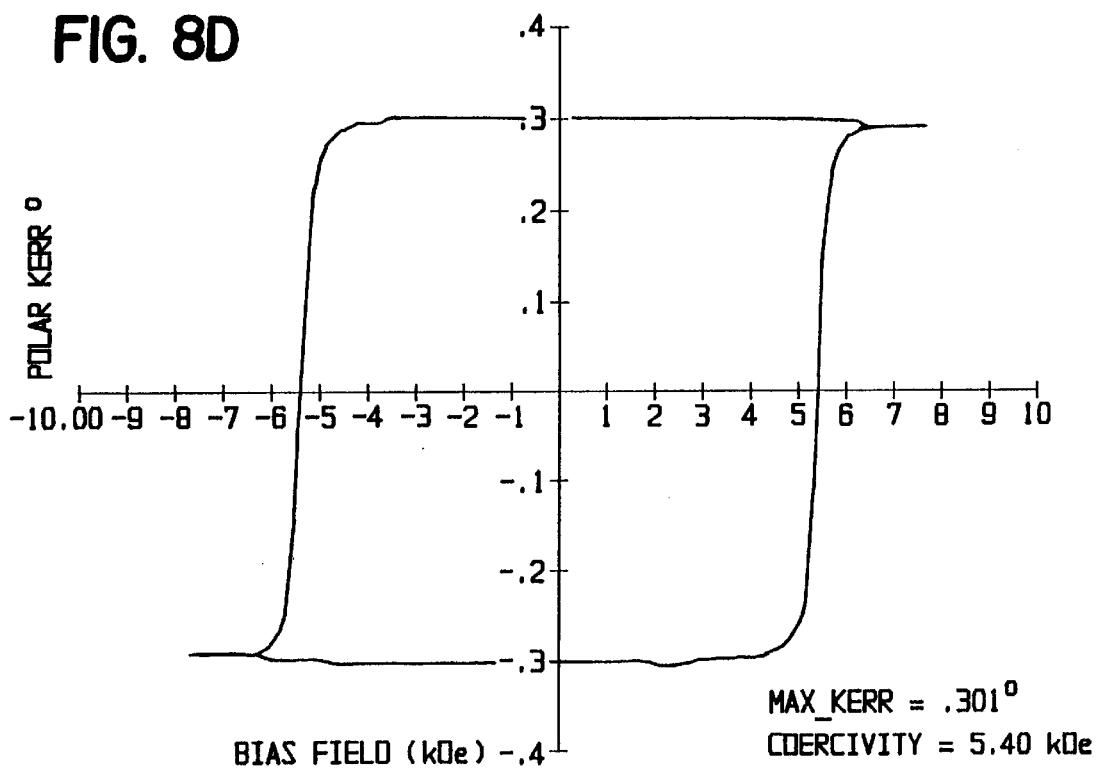

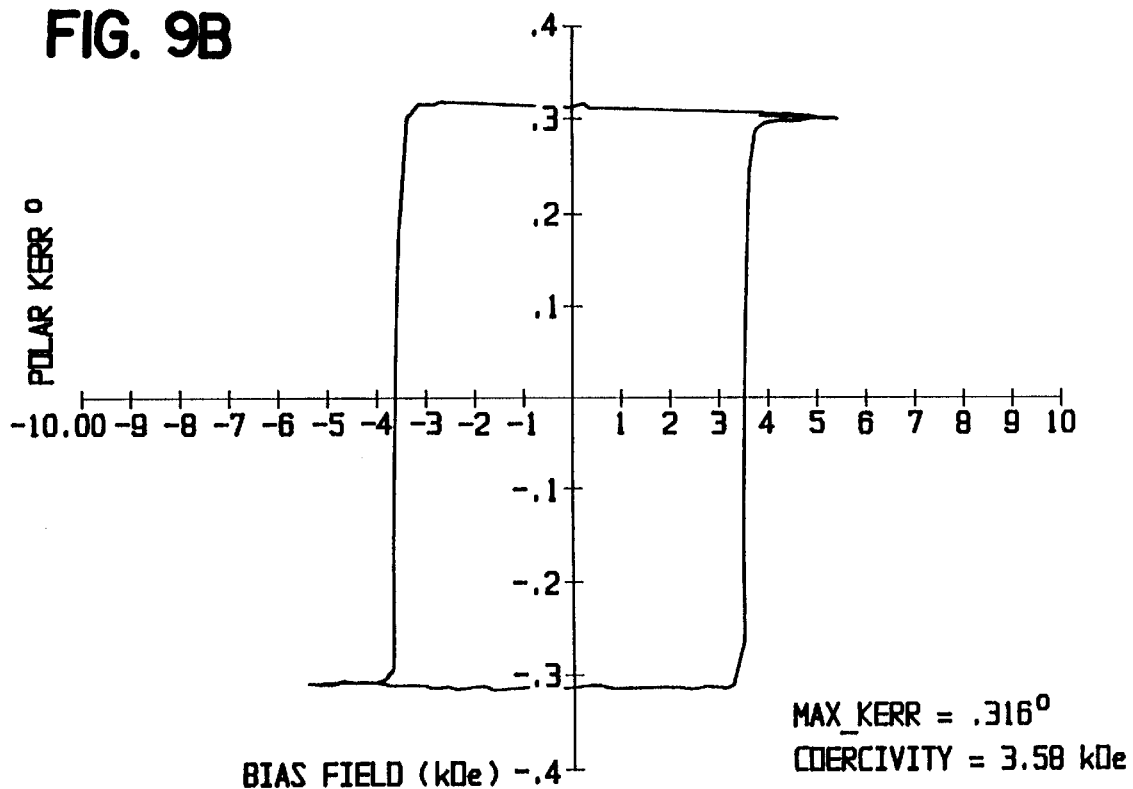
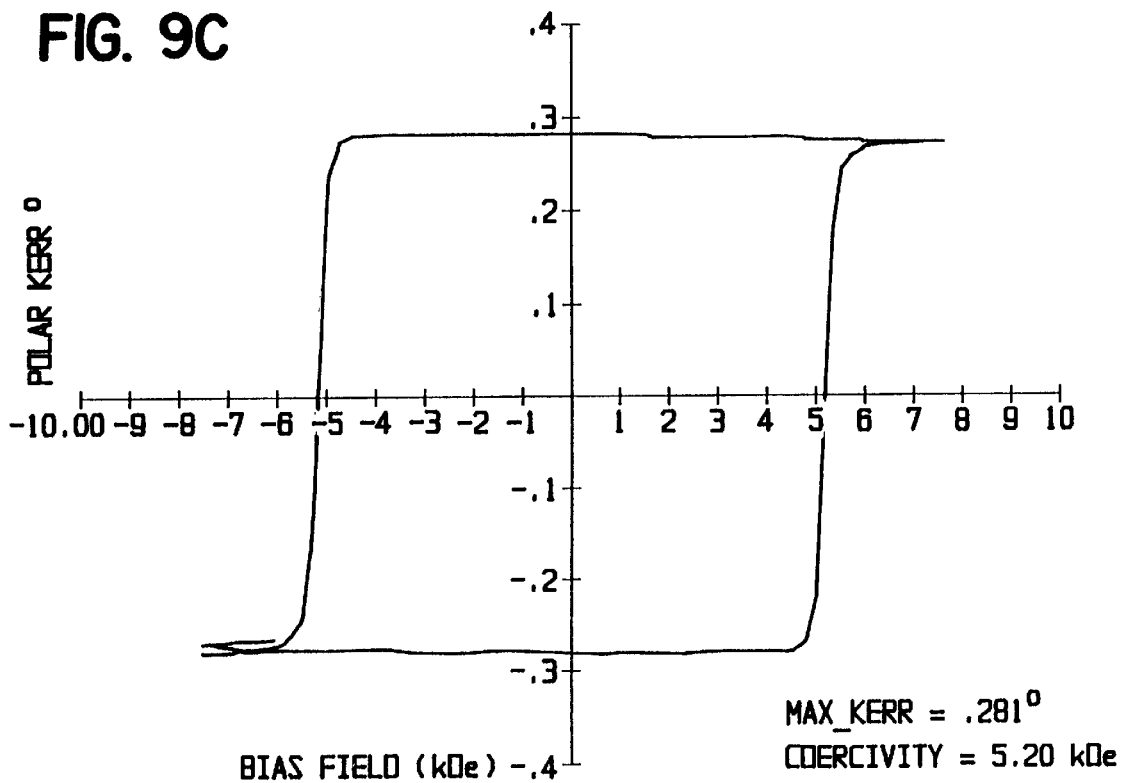

MAX_KERR = .249°
COERCIVITY = 4.81 kOe

MAX_KERR = .242°
COERCIVITY = 5.55 kOe

MAX_KERR = .244°
COERCIVITY = 6.04 kOe

MAX_KERR = .3°
COERCIVITY = 6.02 kOe

MAX_KERR = .322 °
COERCIVITY = 3.55 kOe

MAX_KERR = .349 °
COERCIVITY = 2.1 kOe

MAX_KERR = .329 °
COERCIVITY = 3.3 kOe

COERCIVITY = 6.25 kOe

MULTILAYER FILM MATERIALS SYSTEM

This application is a continuation of application Ser. No. 08/554,926 filed Nov. 9, 1995 now abandoned which in turn is a continuation of application Ser. No. 08/304,592 filed Sep. 12, 1994 (now abandoned) which in turn is a continuation of application Ser. No. 07/996,685, filed Dec. 24, 1992 (now abandoned).

BACKGROUND OF THE INVENTION

This invention relates to a novel platinum/cobalt multilayer film materials system and to an improved process for the manufacture of metal multilayer films.

Thin films with perpendicular magnetic anisotropy are potential candidates in high density magnetic and magneto-optical (MO) recording. Amorphous rare earth transition metal alloy films have become the dominant MO recording media. However, there are a number of major disadvantages associated with these films, eg they suffer from poor corrosion resistance and easy oxidation, necessitating the use of passivating underlayers and overcoats, and small Kerr rotation at short wavelengths, preventing their use for high density recording with shorter wavelength or "blue" lasers. Pt/Co and Pd/Co multilayers have been proposed as MO media candidates. Pt/Co multilayers are preferred because they exhibit a higher polar Kerr effect than Pd/Co multilayers, particularly at shorter wavelengths.

In order to be potentially useful for magneto-optical recording, a material must have, in addition to perpendicular magnetic anisotropy, a square polar Kerr hysteresis loop, a sufficient polar Kerr rotation ($\theta_k$), and a sufficiently large room temperature coercivity ($H_c$). An unenhanced polar Kerr rotation of around 0.1° would be regarded as sufficient for MO purposes, although higher values, say around 0.2°–0.3°, would be preferred. There are known ways of enhancing polar Kerr rotation. Coercivity plays a key role in thermomagnetic recording, and should be larger at room temperature than the field applied during writing. Otherwise, write-magnetic fields can change adjacent previously-written information in a multilayer. In general, coercivities of about 1000 Oe (80 kA/m) are sufficiently high. However, high coercivity alone is not enough to make a multilayer film suitable for magneto-optical recording. A square polar Kerr hysteresis loop is also required. Such a loop is defined by W B Zeper et al in "Hysteresis, microstructure, and magneto-optical recording in Co/Pt and Co/Pd multilayers", J. Appl. Phys., 70 (4), 15 Aug. 1991, where the "squareness" of the loop is defined as the rectangular ratio $r=H_n/H_c$, where r is the rectangular ratio, $H_n$ is the nucleation field and $H_c$ is the coercive field. $H_n$ and $H_c$ are shown in FIG. 1. For a magneto-optical recording medium r=1 is the optimum where the Hc is also large. However, to our knowledge there is no widely accepted definition of what value of r indicates a square loop and what would fail to be considered square. We would suggest that a value of r of under about 0.8 would fail to define a square loop.

The best MO recording performances are achieved in Pt/Co multilayers which are deposited by evaporation or molecular beam techniques. Although sputtering techniques are preferred over these techniques, because of its ease of use in large scale manufacture, sputtered films generally have insufficient coercivity at room temperature to be of use in magneto-optic recording. For example, Ochiai et al, Jap J Appl Phys 28, L659 (1989) and Ochiai et al, Digest of the Int'l Mag Conf 1989 Wash, D.C. report $H_c$ of only 100–350 Oe (8–28 kA/m) for sputtered Pt/Co multilayers which they prepared by using argon as the sputter gas. These values of $H_c$ are less than or the same order of magnitude as that used as a write-magnetic field, which is typically about 40 kA/m. As a result, write-magnetic fields can change adjacent previously-written information in known Pt/Co multilayers, when writing new information.

WO 91/08578 discloses a sputtering process for making a platinum/cobalt multilayer film comprised of alternating layers of platinum and cobalt, using as the sputter gas krypton, xenon, or a mixture thereof. Multilayer films having a room temperature coercivity of 620–1495 Oe are disclosed and compared with room temperature coercivities 265–360 Oe for multilayer films having the same thickness and number of cobalt and platinum layers, sputtered in argon. It is concluded that the multilayer films sputtered in argon would not be useful for magneto-optical recording.

Pt/Co multilayer films may therefore be of use in MO applications provided a sufficient room temperature coercivity is achieved whilst also maintaining the other properties described above. Various attempts have been made to improve $H_c$, such as the use of underlayers.

For example, Y Ochiai et al, EP 0304873 disclose studies of sputtered Pt/Co multilayers including the use of underlayers to increase $H_c$. However, generally only marginal improvements in $H_c$ were achieved and the singular best result of 700 Oe (56 kA/m) requires a 1000 Å (100 nm) thick Pt underlayer. This is impractical for most magneto-optical recording applications because it prohibits reading and writing information from the substrate side and the relatively large heat capacity and thermal diffusivity of such a thick Pt layer will likely inhibit writing with the limited power available with current solid-state lasers.

Underlayers of zinc oxide or indium oxide, thickness about 200 to about 4500 Å. are disclosed in WO 91/14263. Room temperature coercivities of 1090–2900 Oe are achieved. A complicated process wherein the oxide layer has to be sputtered in the presence of oxygen, while the multilayer is sputtered in a separate vacuum chamber. Transfer from one chamber to the other exposes the zinc oxide film to the atmosphere and an additional process step is required to remove any contamination occurring during exposure.

Other work has involved heating of growth surfaces, or substrates, to improve the properties of the deposited film.

SUMMARY OF THE INVENTION

We have invented a novel, sputtered, Pt/Co multilayer film materials system having superior room temperature coercivity, a square polar Kerr hysteresis loop, and sufficient polar Kerr rotation, which may be used as a magneto-optical recording medium.

Accordingly, this invention provides a sputtered Pt/Co multilayer film materials system having a polar Kerr rotation of above 0.1, a square polar Kerr hysteresis loop, and a room temperature coercivity in excess of 2000 Oe, comprising a substrate material; a metal interlayer comprising platinum, of deposited thickness up to 200 Å; and a Pt/Co multilayer.

The room temperature coercivity of the Pt/Co multilayer film materials system of the present invention, comprising a substrate material; a metal interlayer comprising platinum, of deposited thickness up to 200 Å; and a Pt/Co multilayer, may be significantly in excess of 2000 Oe, such as in excess of 3000 Oe, or in excess of 4000 Oe, or in excess of 5000 Oe.

This invention also provides a sputtered Pt/Co multilayer film materials system having a polar Kerr rotation of above 0.1, a square polar Kerr hysteresis loop, and a room temperature coercivity in excess of 1000 Oe, comprising a substrate material; a non-platinum metal interlayer of deposited thickness up to 100 Å; and a Pt/Co multilayer.

The non-platinum metal interlayer may comprise a metal selected from the group Pd, Co, Au, Ag, Rh, Ir and Cu. Preferably the non-platinum metal interlayer comprises a metal selected from the group Pt, Pd, Co, Au and Ag.

For ease of reading and writing information from the substrate side, thinner interlayers are much preferred. Therefore, the platinum or non-platinum metal interlayer preferably has a deposited thickness of up to 50 Å, such as 5–20 Å.

The substrate material may be any suitable material such as a suitable metal or dielectric material or a polymer such as polycarbonate or glass. In a commercial MO disc it is common practice to include an "optical enhancement layer", such as silicon nitride, between the substrate and the MO material. For the purposes of the invention of this application, therefore, references to a substrate are intended to include substrates on which are deposited one or more layers of materials for optical enhancement. For example therefore, the substrate material may be glass or glass on which is deposited a material selected from the group silicon, silicon nitride and silicon dioxide.

In the multilayer, each cobalt layer preferably has a thickness of up to 12 Å and each platinum layer preferably has a thickness of up to 24 Å. Most preferably, the thickness of each cobalt layer is 2–5 Å and each platinum layer 6–15 Å. Preferably, the total multilayer film has a thickness of less than 500 Å. Preferably, the multilayer film comprises up to 20 layers in total, or 10 "periods" of Pt/Co, for example 5–10 periods.

The multilayer films of the present invention benefit from enhanced coercivity while achieving square polar Kerr hysteresis loops, without the disadvantage which is demonstrated by the prior art metal interlayer MO films in that reading and writing information from the substrate side is prohibited. Coercivities in excess of 5 kOe have been achieved using ultra-thin Pt underlayers, 16 Å thick as deposited. In possessing the facility to read and write from the substrate side, the multilayer films of the present invention enjoy a significant advantage over the prior art metal interlayer MO films.

The multilayer film materials system of the present invention may be used in any typical magneto-optic disc configuration. Therefore, the present invention further provides a magneto-optic disc comprising the multilayer film materials system of the present invention. Typically such a disc would include an optical enhancement layer on the substrate. Optionally, a further optical enhancement layer may be provided on top of the multilayer. and/or a reflective layer of eg Al may be provided.

The process by which the multilayer films of the present invention are made is suitable for making not only Pt/Co multilayers, but any metal multilayer.

Therefore, another object of this invention is to provide an improved process for the manufacture of metal multilayer films which have a metal interlayer and are suitable for magneto-optical recording.

Accordingly, this invention provides a process for the manufacture of metal multilayer films suitable for magneto-optical recording comprising:

i. sputter deposition onto a substrate material, of a metal interlayer; and ii. sputter deposition onto the interlayer of a metal multilayer, wherein at least one of the substrate and the metal interlayer is subjected to hyperthermal processing comprising high energy particle bombardment.

Preferably, both the substrate material and the metal interlayer are subject to hyperthermal processing.

Hyperthermal processing of the metal interlayer may be carried out simultaneously with, or subsequent to, sputter deposition of said interlayer. Said hyperthermal processing will have the effect of reducing the as-deposited thickness of the metal interlayer.

Sputter deposition may be carried out via any suitable means. Many such means, such as dc or rf or microwave magnetron-, diode-, or triode-sputtering, or sputtering of targets through bombardment by energetic particles from ion or atom guns, are well known in the art.

During multilayer sputtering, the distance between the substrate and the sputter sources of the components of the multilayer may be different, and are variable according to the initial energy of particles leaving the sputtering target and the nature, pressure, composition and temperature of the sputter gas during sputtering, according to the pressure distance relationship, in order to achieve desirable low arrival energy of condensing metal particles at the substrate during film growth.

Sputter deposition of the interlayer may be carried out in any noble gas or mixture of noble gases. The preferred sputter gases are Ar, Kr and Xe. The rate of sputtering may be up to several hundred Å/s of metal but is preferably up to 100 Å/s, eg up to 10 Å/s.

Hyperthermal processing is used in order to influence the surface characteristics of the substrate and/or metal interlayer, prior to deposition of the interlayer or multilayer. In the initial stages of film growth, the nature of the substrate surface exerts a critical influence on the developing film structure. The thin nature of a Pt/Co thin film multilayer permits some degree of control of film growth through surface engineering of growth surfaces to develop aspects of film microstructure beneficial to MO properties. In the process of the present invention there is no need to apply heat in order to advantageously enhance MO properties. The suitably engineered growth surface is riot erased by the use of low energy particles in film deposition, and therefore a growth mode providing desirable MO characteristics in the MO film is allowed to be established.

Hyperthermal processing may conveniently be provided by for example the application of an rf excitation or dc bias to the substrate table, in a low pressure atmosphere, or by placing the substrate or interlayer close to a plasma source, in a low pressure atmosphere, or by particle bombardment from particle guns such as ion or atom guns.

Where rf excitation is employed in hyperthermal processing performed on the substrate, where interlayers of as-deposited thicknesses of up to approximately 50 Å are to be applied, the applied energy density inducing high energy particle bombardment may conveniently be up to 300 Jcm$^{-2}$ with power densities conveniently up to 0.35 Wcm$^{-2}$. However, depending on the nature of the substrate greater values of energy density and power density may be used.

In a specific example, where rf excitation is employed in hyperthermal treatment of the interlayer, for approximately 16 Å and 25 Å as-deposited Pt interlayer thicknesses on a glass microscope slide, no significant benefit is obtained for energy densities in excess of 100 Jcm$^{-2}$ and power densities in excess of 0.3Wcm$^{-2}$. Optimum values of coercivity are obtained in interlayer hyperthermal processing having values of approximately 20 Jcm$^{-2}$ and 0.067Wcm$^{-2}$ for 16 Å thick Pt interlayers. For the 25 Å thick Pt interlayers optimum coercivity is observed with the interlayer hyperthermal processing at approximately 40 Jcm$^{-2}$ and 0.1 33 Wcm-2. The substrate hyperthermal processing was 140 Jcm$^{-2}$ at 0.33Wcm$^{-2}$ throughout. For different metal interlayers and different as-deposited interlayer thicknesses, different values of energy density and power density will give optimum coercivity, for a given substrate and substrate hyperthermal processing regime.

Sputtering of the metal multilayers may be in any of the noble gases or mixture of noble gases. The preferred sputter gases are Ar, Kr and Xe. The rate of sputtering may be typically up to 20 Å/s of metal.

The ability to deposit the multilayer in an argon atmosphere is a substantial economic advantage compared to the prior art recommendations of using xenon or krypton.

The metal multilayer or the metal interlayer may be thermally treated after deposition. Preferably the metal multilayer is thermally treated after deposition. Said thermal treatment is advantageously carried out in the presence of oxygen, for example in air or in a mixture of gases including air and/or oxygen gas. The effect of the thermal treatment is variable according to pressure of oxygen. It may be reasonably expected that the use of pressures above atmosphere may be advantageous. Alternatively, it is thought that said thermal treatment may be carried out in an atmosphere in which oxygen is present as a combined species.

In general the thermal treatment comprises the stages of heating, settle, and cool-down although the settle stage is not essential. Heating may be up to a temperature of about 200°–300° C., such as 200°–250° C., and may be at any rate, such as around 10° C./s or around 100° C./s. The rate of heating is not of essential importance. The heating may be carried out in one or more stages, with or without the reaching of thermal steady state after each stage. Exposure to heating may be continuous or cycled, or part-continuous and part-cycled. Said heating may be provided by any suitable means—for example, heating may be carried out in a furnace, or the sample may be placed in a vessel to be heated, or heating may be provided by one or more than one continuous resistive heat source or lamp source, such as filament or discharge lamp source. Accordingly, light bulbs, such as halogen light bulbs, may be employed as the heating source in the present invention. Where light bulbs are employed, one or more may be used. In the method of the invention these are placed, with spatial separation from the multilayer film, around, eg above and below, the film. The distance between any bulb and the multilayer film varies, eg according to the wattage of the bulb, the thickness of the film, and the thermal properties of the substrate. Advantageously, the bulbs are surrounded by curved reflectors, to intensify and/or make uniform the radiation at the film samples. It is advantageous to use parabolic reflectors to achieve uniform illumination of the sample.

The second stage of the thermal treatment is the optional settle stage wherein the material is maintained at temperature for a period of time, such as up to 30 minutes, or preferably up to one minute. Thereafter the material is cooled or allowed to cool in one or more stages and if desired at varying rates. Any rate of cooling may be used, such as up to 10° C./s, or preferably up to 100° C./s. Any suitable method of cooling may be employed. If desired, said thermal treatment may be carried out in a magnetic field.

In a commercial environment, rates of heating and cooling would be as high as possible.

BRIEF DESCRIPTION OF THE DRAWINGS

FIGS. 6A–6C illustrate data from Examples 6A–6C, respectively.

FIG. 7 illustrates data from Example 6D.

FIGS. 8A–8L illustrate data from Examples 8A–8L, respectively.

FIGS. 9B and 9C illustrate data from Example 9B.

DETAILED DESCRIPTION OF THE INVENTION

Figure 1:
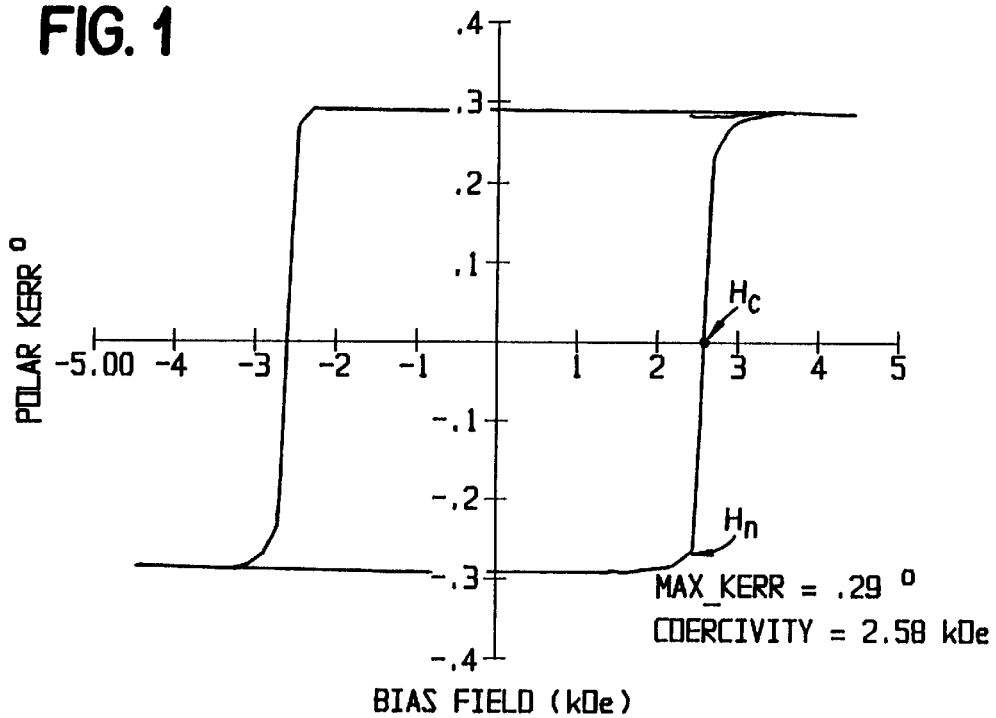
FIGS. 1–1A illustrate data from Examples 1–1A, respectively.
Figure 1A:
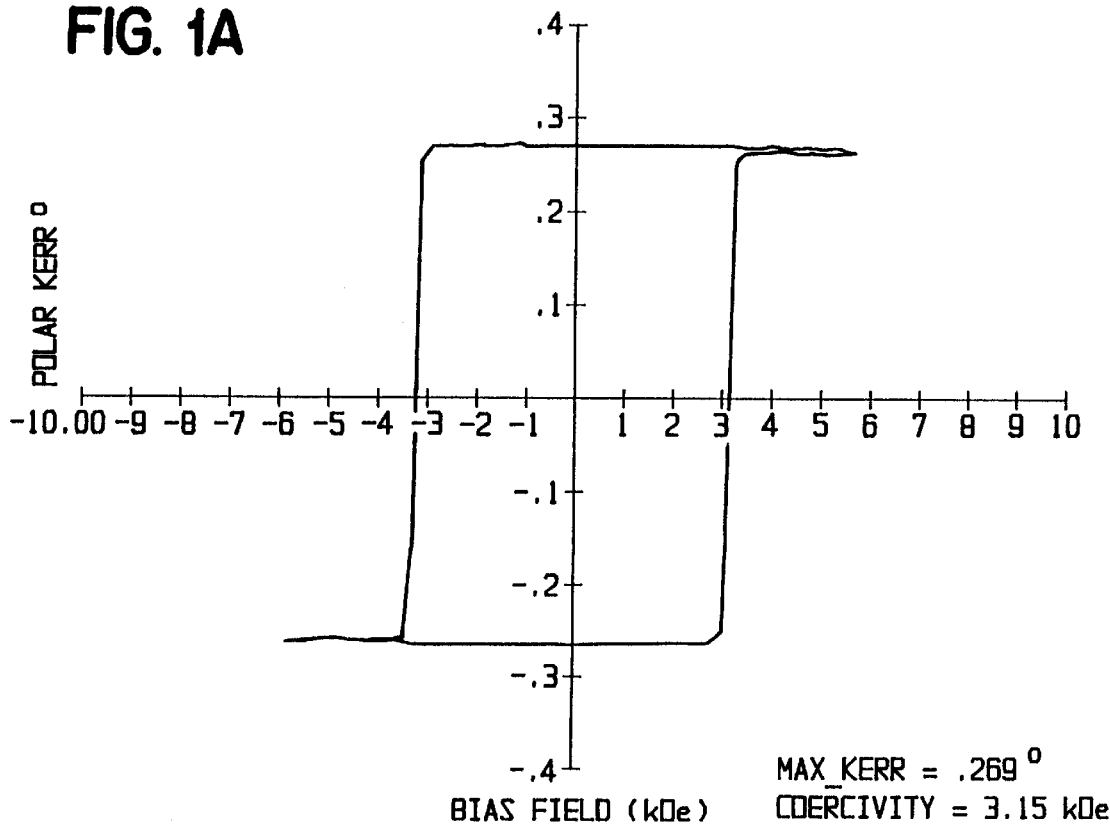

The invention will now be described in the following examples, which are intended to illustrate but not to limit the scope of the invention.

Examples 1–1C illustrate sputtered Pt/Co multilayer film materials systems having a 16 Å thick Pt interlayer. The film of Example 1C is sputtered in xenon.

Examples 2 and 2 Å illustrate sputtered Pt/Co multilayer films with 8 Å and 50 Å thick Pt interlayers.

Example 3 uses interlayers of Pt, Pd, Co. Au and Ag. Cu.

Examples 4 and 4A employ silicon and silicon nitride "substrates" ie the interlayer is sputtered onto silicon or silicon nitride, but the true substrate would be silicon or silicon nitride on, say, glass.

Example 5 varies the ratio of Pt/Co in the multilayer and the stack height of the multilayer.

Examples 6A–D illustrate the effects of hyperthermal processing.

Examples 7A–F investigate the response of the metal multilayer to thermal treatment.

Examples 8A–L investigate the relationship between hyperthermal processing and thermal treatment of the interlayer.

Examples 9–12 compare films subject to various types of thermal treatment as compared with films not so treated.

Example 13 investigates the effect of atmosphere on the effect of thermal treatment.

Example 14 illustrates a Pd/Co system, and Example 15 illustrates Pd/Co systems having different interlayers.

Magneto-optic measurements were performed at 670 nm using a custom-built polar Kerr loop tracer. Unless otherwise indicated, measurements were made through the multilayer side of the materials.

In all Examples the sputtering machine used was a modified Nordiko NS3750, supplied by Nordiko Ltd. of Havant, Hampshire, UK, and modified at the Johnson Mitthey Technology Centre. The sputtering electrodes in all cases were dc and/or rf planar magnetrons. Unless otherwise stated, all heat treatments were carried out in air, at atmospheric pressure.

EXAMPLE 1

Properties obtained

Square polar Kerr hysteresis loop

Room temperature coercivity of 2.58 kOe

Polar Kerr rotation 0.29°

A pre-cleaned glass substrate was mounted onto a substrate table in a vacuum chamber, and the chamber pumped to a base pressure of $2.5 \times 10^{-6}$ mb.

Pure Ar gas was metered into a pumped chamber to attain a pressure of $1.5 \times 10^{-2}$ mb and the system allowed to equilibrate for several minutes. ("Gas Equilibration 1").

The octagonally-faced substrate table of total surface area 2960 cm$^2$ was situated 11 cm from a platinum sputter source and 11 cm from a cobalt sputter source and rotated at 6 rpm, whilst 1000 watts of constant radio frequency (rf) power al 13.56 MHz, equivalent to 0.34 Wcm$^{-2}$ was applied to the table for 7 minutes establishing the table at a negative bias of approximately 245 V with respect to ground potential ("Hyperthermal Treatment S1").

With the substrate table obscured by shutters from a planar magnetron source fitted with an 8"×4" Pt target, 124 W of dc power was applied to the sputter source for several minutes, to clean the sputter target and establish a steady state of operation ("Target Pre-Conditioning Stage").

The Pt interlayer was then deposited in two sequential passes by the Pt sputter source, establishing a total thickness of 16 Å. The power supplied to the sputter electrode was 124 W, the electrode bias was −414 V with respect to ground potential. The substrate was at a negative potential of 12 to 15 V with respect to ground potential. The substrate to target separation was 11 cm and the table was rotated at 6 rpm ("Interlayer Deposition").

The surface of the Pt interlayer was then hyperthermally treated by applying rf power (13.56 MHz) to the substrate table. 200 W of rf power was applied for a period of 5 minutes, establishing a table bias with respect to ground of −105 V, the substrate table rotating at 6 rpm ("Hyperthermal Treatment S2").

The source of Co flux for the production of the desired multilayer structure was provided by a rf planar magnetron source located directly opposite but facing the Pt source. The flux from either source was obscured by the substrate table positioned between them. A thin cobalt target was used (8"×4"×1 mm) to enhance the magnetron sputtering effect. With the substrates obscured from both sputter sources, power was applied to each source at the values required for the respective deposition rates of Pt or Co respectively, for fabrication of the multilayer structure. This situation was maintained for several minutes enabling equilibration of the sputter sources at the respective power settings for the required deposition rates ("Target Pre-Conditioning Prior to Multilayer Deposition").

The shuttering obscuring the substrate table was removed such that the flux from both sources was incident at the table, and the substrates rotated past the sources producing an alternating structure of Pt and Co layers. The first and last layers being Pt, a structure of 19 layers in total in 9.5 table rotations, was achieved. The table rotation was 6 rpm and constant rf power applied to the cobalt sputter electrode to achieve a deposition of approximately 3 Å thick Co layer per substrate pass. Constant dc power applied to the Pt sputter electrode achieved approximately an 8 Å thick Pt layer per pass. ("Multilayer Deposition"). 124 W of dc power was applied to the Pt sputter electrode, establishing a bias of −414 V on the Pt target. 400 W of rf power was used to establish a self-bias of −600 V with respect to ground on the Co target. The substrate was at a negative potential of 1 to 2 V with respect to ground. The gas metering and separations of the sputter electrodes with respect to the substrate table were as previously described under "Hyperthermal Treatment S1".

The glass substrate with the deposited multilayer was removed from the sputtering chamber.

The polar Kerr hysteresis loop for this Example is shown in FIG. 1.

EXAMPLE 1A

Properties obtained

Square polar Kerr hysteresis loop

Room temperature coercivity 3.15 kOe

Polar Kerr rotation 0.269°

The procedure of Example 1 was followed with the following notable adjustments:

In the "Target pre-conditioning" stage, 120 W of dc power was applied.

During the "Interlayer Deposition" stage, the dc power supplied to the electrode was 120 W at −414 V with respect to ground potential.

After "Hyperthermal Treatment S2", the argon gas pressure was adjusted to $2.5 \times 10^{-2}$ mb. ("Gas Equilibration 2").

In the "Multilayer Deposition" stage 120 W of dc power was applied to the dc electrode establishing a bias of −400 V on the Pt sputtering target.

The polar Kerr hysteresis loop obtained is shown in FIG, 1A.

EXAMPLE 1B

Properties obtained

Square polar Kerr hysteresis loop

Room temperature coercivity 5.06 kOe

Polar Kerr rotation 0.30°

The procedure of Example 1A was followed with the following notable adjustments:

The substrate was an optical disc glass substrate, manufactured by Pilkington Micronics, Clwyd.

During the "Gas Equilibration 2" stage the argon gas pressure was adjusted to $3.5 \times 10^{-2}$ mb.

In the "Multilayer Deposition" stage 120 W of dc power was applied to the dc electrode establishing a bias of −380 V on the Pt sputtering target. 400 W of rf power was used to establish self-bias of −570 V with respect to ground potential on the Co target.

Figure 1B:
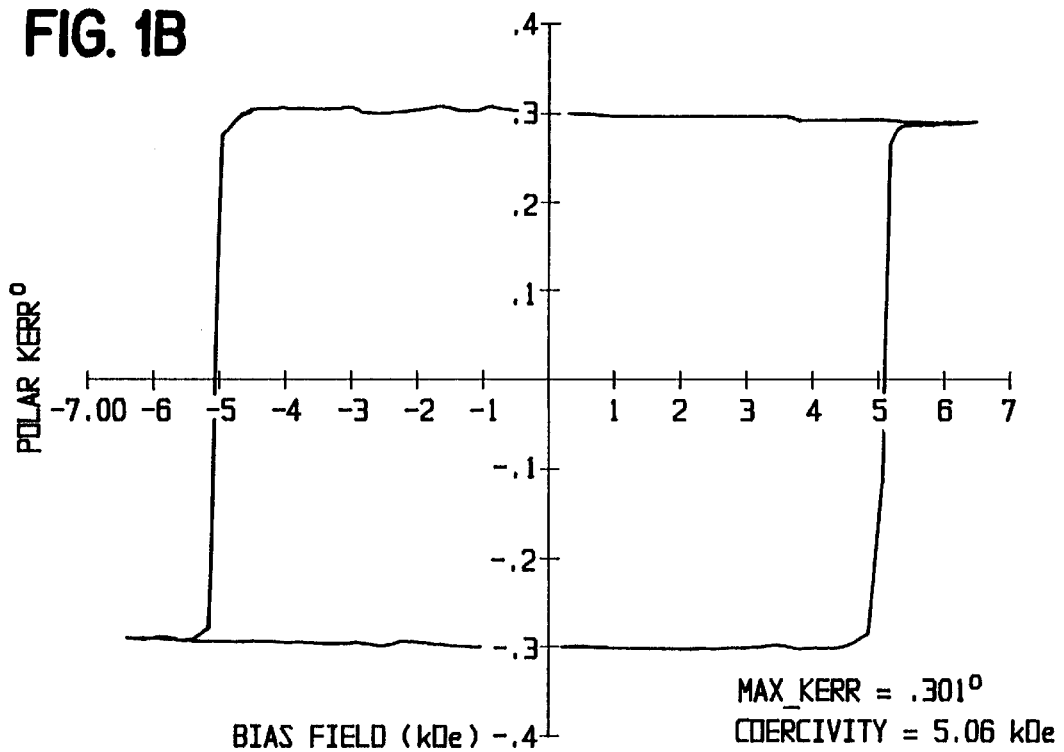
FIGS. 1B and 1C illustrate data from Example 1B.
Figure 1C:
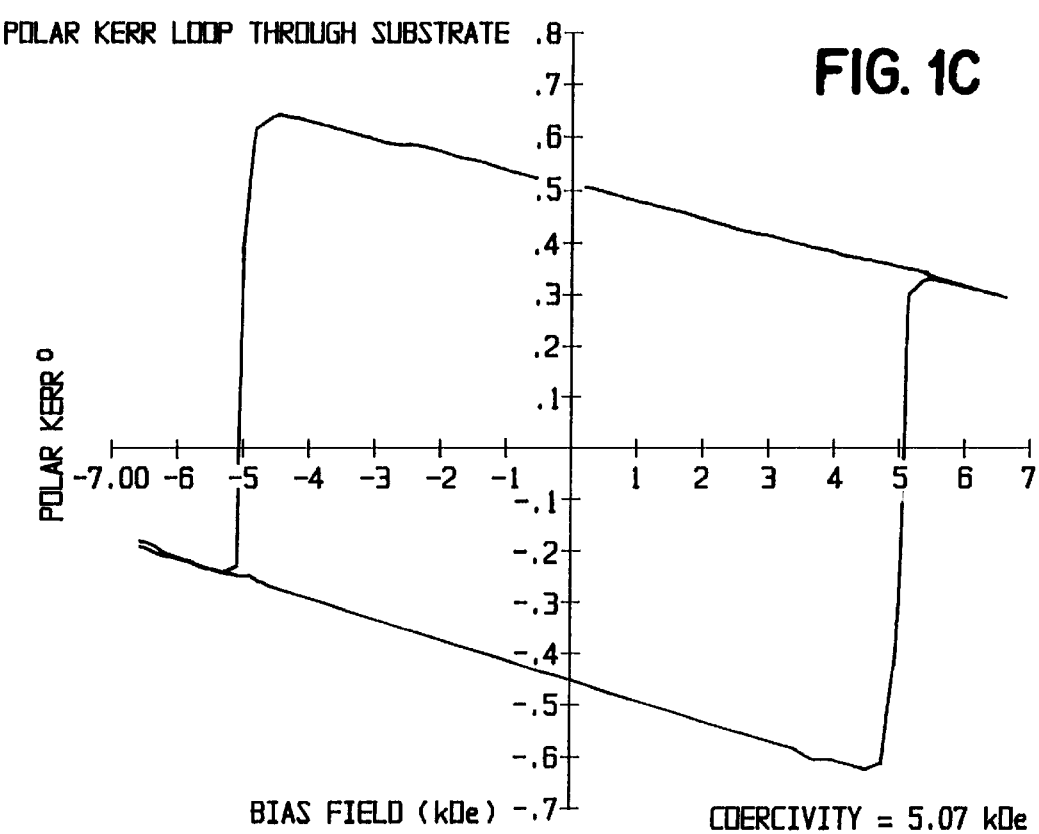

The polar Kerr hysteresis loop obtained is shown in FIG. 1B. FIG. 1C gives the loop obtained through the substrate side of the material.

EXAMPLE 1C

Properties obtained

Square polar Kerr hysteresis loop

Room temperature coercivity 4.78 kOe

Polar Kerr rotation 0.285°

The procedure of Example 1A was followed with the following notable adjustments:

The substrate was a glass microscope slide.

During the "Gas Equilibration 2" stage the argon gas was pumped from the chamber and Xe gas admitted such that a pressure of $1.3 \times 10^{-2}$ mb was established.

In the "Multilayer Deposition" stage 120 W of dc power was applied to the dc electrode establishing a bias of −624 V on the Pt sputtering target. 400 W of rf power was used to establish self-bias of −550 V with respect to ground potential on the Co target. The substrate was at a negative potential of 1–2 V with respect to ground potential.

Figure 1D:
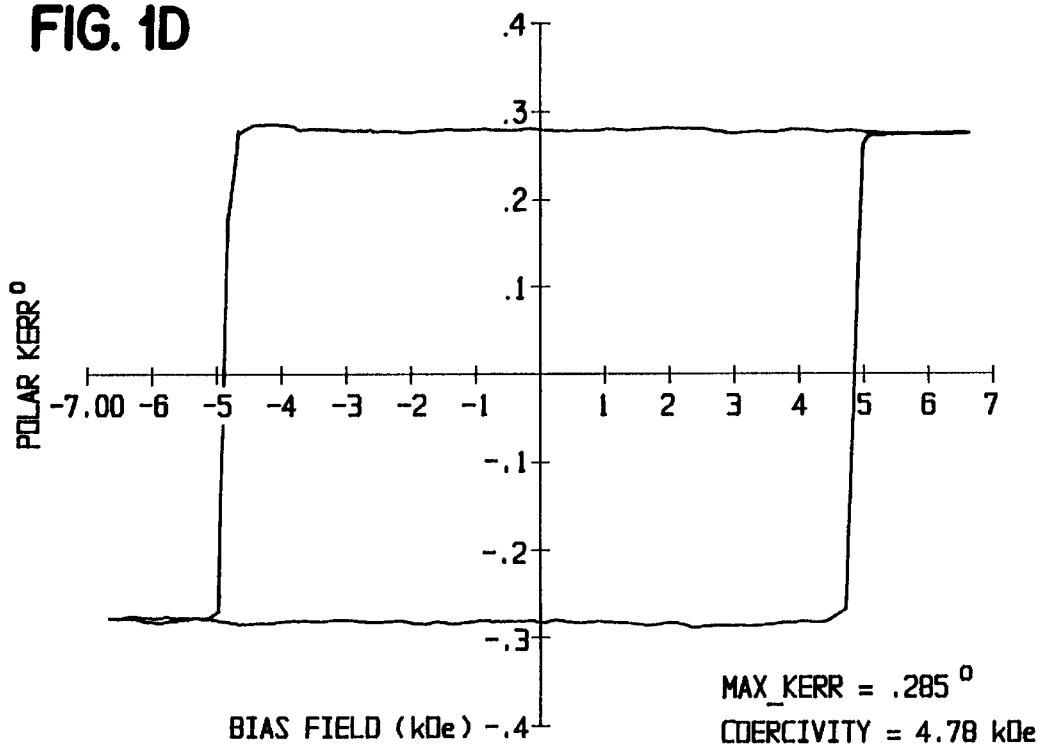
FIGS. 1D and 1E illustrate data from Example 1C.
Figure 1E:
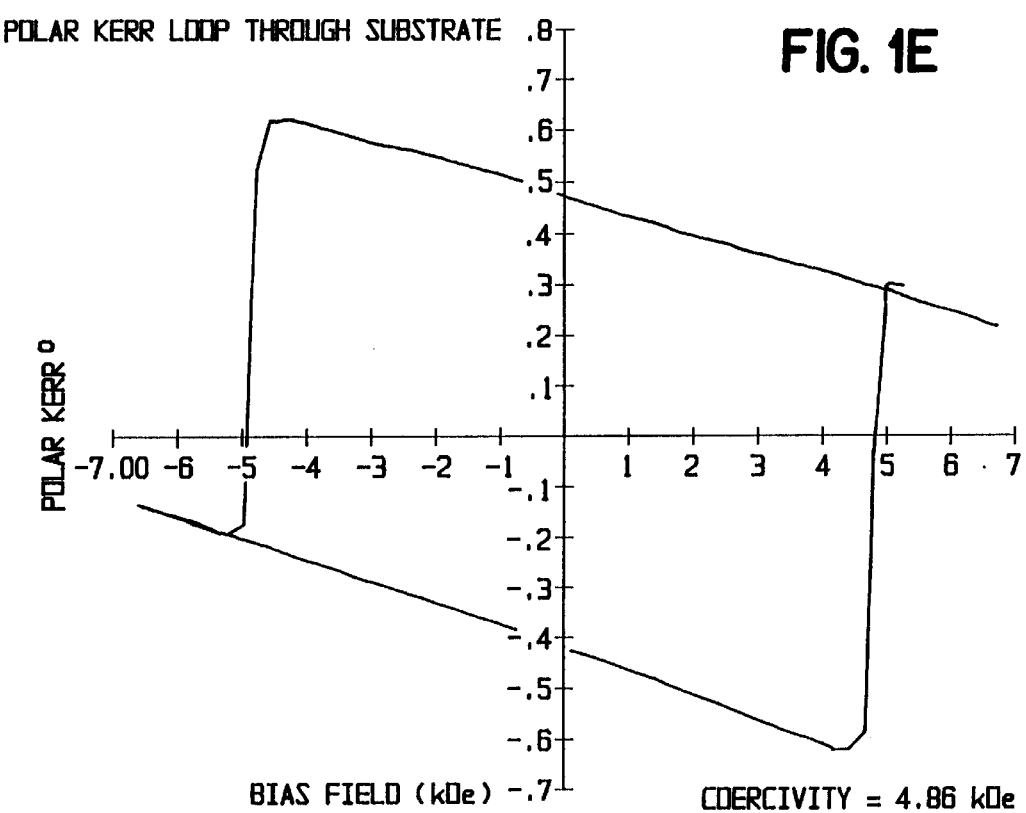

The polar Kerr hysteresis loop obtained is shown in FIG. 1C. FIG. 1D gives the loop obtained through the substrate side of the material.

EXAMPLE 2

Properties obtained

Square polar Kerr hysteresis loop

Room temperature coercivity of 2.59 kOe

Polar Kerr rotation 0.279°

The procedure of Example 1 was followed with the following notable adjustments:

In the "Target Preconditioning" stage, 120 W of dc power was applied.

During the "Interlayer Deposition" stage the dc power supplied to the electrode was 120 W at −414 V with respect to ground potential. An interlayer of total thickness of approximately 8 Å was established in one deposition pass by the Pt sputter electrode.

A "Gas Equilibration 2" stage (see Example 1A) was included, in which the argon gas pressure was adjusted to $2.5 \times 10^{-2}$ mb.

In the "Multilayer Deposition" stage 120 W of dc power was applied to the dc electrode establishing a bias of −386 V on the Pt sputtering target. 400 W of rf power was applied to the Co target establishing a self-bias of −386 V with respect to ground potential.

Figure 2:
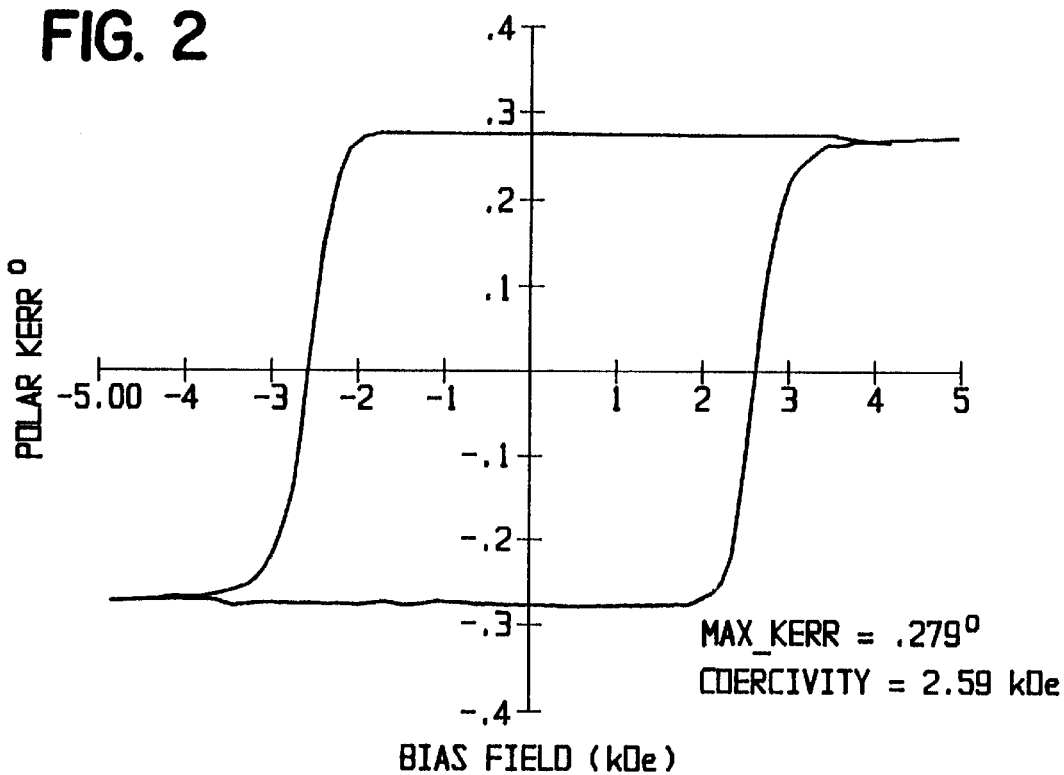
FIG. 2 illustrates data from Example 2.

FIG. 2 shows the polar Kerr hysteresis loop obtained.

EXAMPLE 2A

Properties obtained

Square polar Kerr hysteresis loop

Room temperature coercivity of 3.23 kOe

Polar Kerr rotation 0.225°

Paragraphs 1 and 2 of Example 1 were followed.

The octagonally-faced substrate table of total surface area 2960 cm$^{-2}$ was situated 11 cm from the platinum sputter source and 11 cm from the cobalt sputter source and rotated at 6 rpm, whilst 700 watts of constant rf power at 13.56 MHz was applied for 20 minutes to the table, equivalent to 0.24 Wcm$^{-2}$, established the table at a negative bias of approximately 210 V with respect to ground potential ("Hyperthermal Treatment S1").

With the substrate table obscured by shutters from a planar magnetron source fitted with an 8"×4" Pt target, 120 W of dc power was applied to the sputter source for several minutes, to clean the sputter target and establish a steady state of operation ("Target Pre-conditioning Stage").

The Pt interlayer was then deposited by 6 sequential passes by the Pt sputter source, establishing a total thickness of approximately 50 Å. The power supplied to the sputter electrode was 120 W, the electrode bias was −408 V with respect to ground potential. The substrate was at a negative potential of 12 to 15 V with respect to ground potential. The substrate to target separation was 11 cm and the table was rotated at 6 rpm. ("Interlayer Deposition").

The surface of the Pt interlayer was then hyperthermally treated by applying rf power (13.56 Mhz) to the substrate table. 150 W of rf power was applied for a period of 10 minutes, establishing a table bias with respect to ground of −90 V, the substrate table rotating at 6rpm. ("Hyperthermal Treatment S2").

The argon gas pressure was then adjusted to $2.5 \times 10^{-2}$ mb and allowed to equilibrate. ("Gas Equilibration 2").

The source of Co flux for the production of the desired multilayer structure was provided by a rf planar magnetron source located directly opposite but facing the dc planar magnetron Pt sputter source. The flux from either source was obscured by the substrate table positioned between them. A thin cobalt target was used (8"×4"×1 mm) to enhance the magnetron sputtering effect. With the substrates obscured from both sputter sources, power was applied to each source at the values required for the respective deposition rates of Pt or Co respectively, for fabrication of the multilayer structure. This situation was maintained for several minutes enabling equilibration of the sputter sources at the respective power settings for the required deposition rates ("Target Pre-conditioning Prior to Multilayer Deposition").

The shuttering obscuring the substrate table was removed such that the flux from both source was incident at the table, and the substrates rotated past the sources producing an alternating structuring of Pt and Co layers. The first and last layers being Pt, a structure of 19 layers in total in 9.5 table rotations, was achieved. The table rotation was 6 rpm, and constant rf power applied to the cobalt sputter electrode to achieve a deposition of approximately 3 Å thick Co layer per substrate pass. Constant dc power applied to the Pt sputter electrode achieved approximately an 8 Å thick Pt payer per pass. (Multilayer Deposition"). 120 W of dc power was applied to the Pt sputter electrode, establishing a bias of −391 V on the Pt target. 400 W of rf power was used, to establish a self-bias of −560 V with respect to ground potential on the Co target. The substrate was at a negative potential of 1 to 2 V with respect to ground potential. The gas metering and separations of the sputter electrodes with respect to the substrates tables was as previously described. ("Hyperthermal Treatment S1", "Gas Equilibration 2").

The glass substrate with the deposited multilayer was removed from the sputtering chamber.

Figure 3:
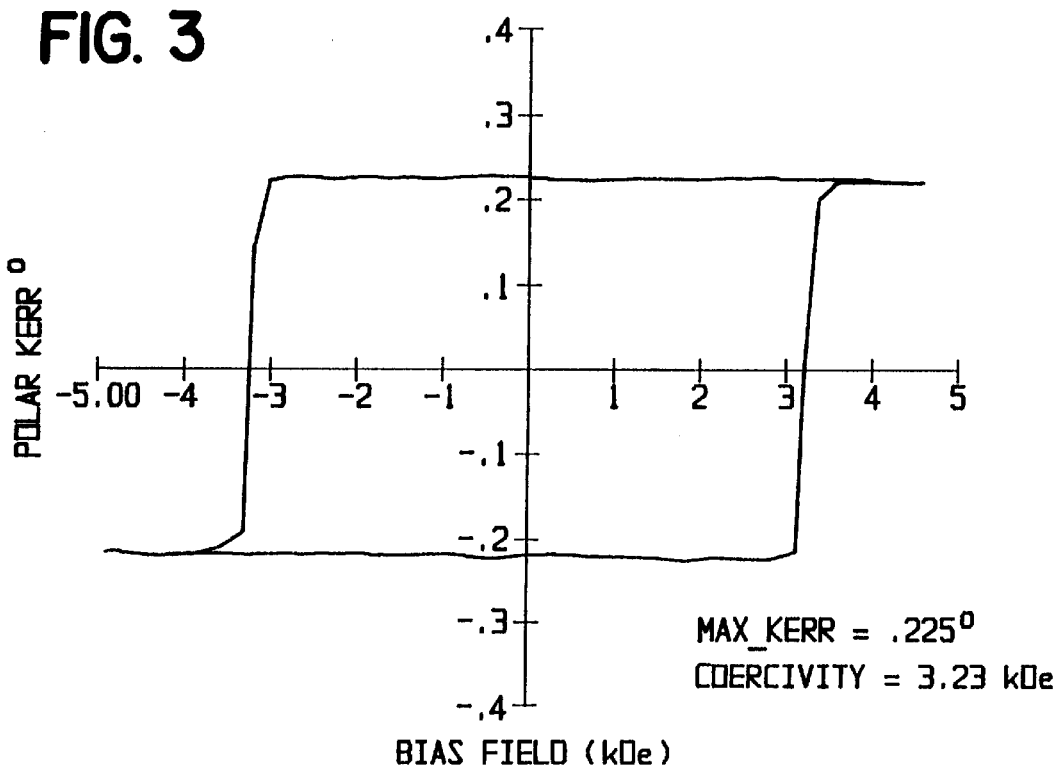
FIG. 3 illustrates data from Example 2A.

The polar Kerr hysteresis loop obtained is shown in FIG. 3.

EXAMPLE 3

The procedure of example 1A was followed with the following notable adjustments:

In the "Interlayer Deposition" stage approximately 50 Å thick Pt or Pd or Co or Ag or Au interlayers were deposited in a manner similar to that described for the Pt into interlayer illustrated in previous Examples with suitable adjustment of power applied to the sputtering target, number of target passes and speed of substrate table rotation to achieve an interlayer thickness of 50 Å.

MO properties obtained were as follows:

"AS-DEPOSITED" SYSTEMS (ie without any thermal treatment)

|  | Interlayer | | | | |
| --- | --- | --- | --- | --- | --- |
|  | Pt | Pd | Co | Ag | Au |
| $H_c$ (kOe) | 2.57 | 1.56 | 1.38 | 1.67 | 1.89 |
| $\theta_k$ (°) | .23 | .22 | .3 | .13 | .17 |

The samples having Pt and Pd interlayers were placed in a furnace at 155° C. for 40 minutes, in an atmosphere of air and at atmospheric pressure. The samples were then removed from the furnace, placed on an Al block. After 2 minutes the temperature of the samples had fallen to room temperature.

The MO properties then measured were as follows:
"THERMALLY TREATED" SYSTEMS

|  | Interlayer | |
| --- | --- | --- |
|  | Pt | Pd |
| $H_c$ (kOe) | 3.31 | 1.82 |
| $\theta_k$ (°) | .21 | .20 |

EXAMPLE 4

Properties obtained

Square polar Kerr hysteresis loop

Room temperature coercivity of 3.19 kOe

Polar Kerr rotation 0.189°

The procedure of Example 1 was followed with the following notable adjustments:

A silicon nitride "substrate" was mounted into the vacuum chamber and the chamber evacuated.

In the "Target pre-conditioning" stage, 120 W of dc power was applied.

During the "Interlayer Deposition" stage the dc power supplied to the electrode was 120 W at −406 V with respect to ground potential.

During the "Gas Equilibration 2" stage the argon gas pressure was adjusted to $2.5 \times 10^{-2}$ mb.

In the "Multilayer Deposition" stage 120 W of dc power was applied to the dc electrode establishing a bias of −384 V on the Pt sputtering target. 400 W of rf power was applied to the Co target, establishing a self-bias of −575 V with respect to ground potential on the Co target.

Figure 4:
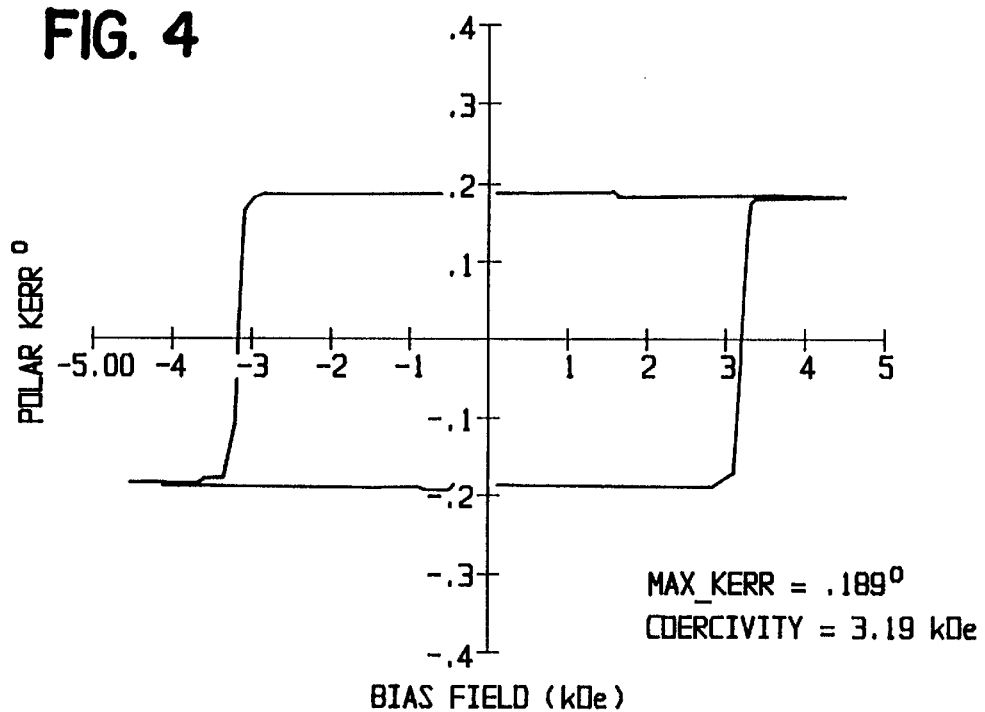
FIGS. 4–4A illustrate data from Examples 4–4A, respectively.

The polar Kerr loop is shown in FIG. 4.

EXAMPLE 4A

Properties obtained

Square polar kerr hysteresis loop

Room temperature coercivity of 3.08 kOe

Polar Kerr rotation 0.146°

The procedure of Example 4 was followed with the following notable adjustments:

A silicon "substrate" was mounted into the vacuum chamber and the chamber evacuated.

Figure 4A:
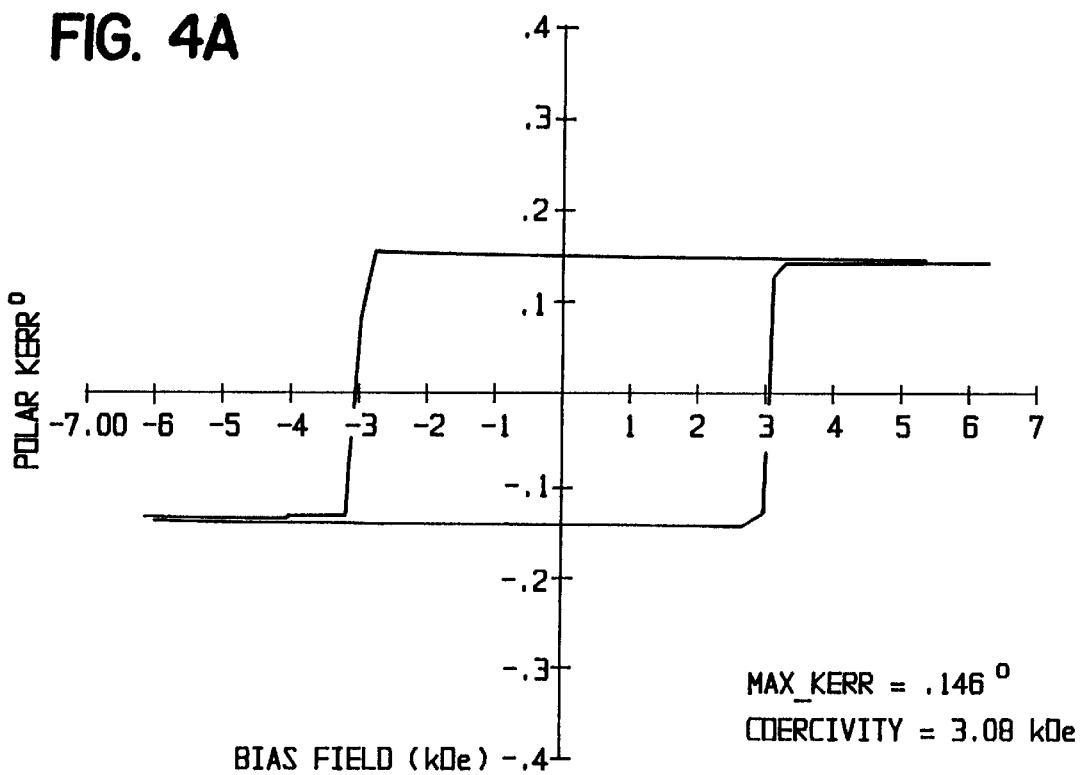

Square loop coercivity is shown in FIG. 4A.

EXAMPLE 5

Properties obtained

Square polar kerr hysteresis loop

Room temperature coercivity of 2.28 kOe

Polar Kerr rotation 0.168°

The procedure of Example 1A was followed with the following notable adjustments:

During the "Gas Equilibration 2" stage the argon gas pressure was adjusted to $2.5 \times 10^{-2}$ mb In the "Multilayer Deposition" stage the structure comprised 15 layers in total in 7.5 table rotations. Approximately 3 Å of Co and 15 Å of Pt were deposited on each pass by each respective electrode. 215 W of dc power was applied to the dc electrode establishing a bias of −422 V on the Pt sputtering target. 400 W of rf power was used to establish self-bias of −570 V with respect to ground potential on the Co target. The substrate was at a negative potential of 1 to 2 V during multilayer deposition.

Figure 5:
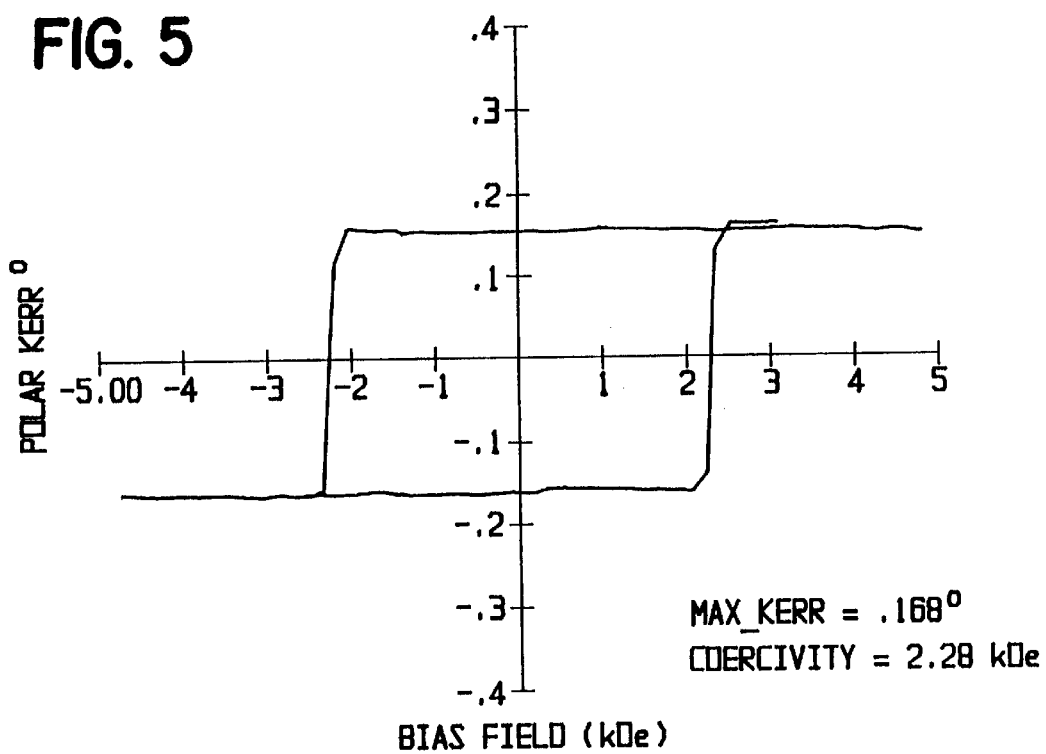
FIG. 5 illustrates data from Example 5.

FIG. 5 shows the polar Kerr loop obtained.

EXAMPLES 6A–6D

The procedure of Example 1A was followed with the following notable adjustments:

During the "Interlayer Deposition" stage the dc power supplied to the electrode was 120 W at −409 V with regard to ground potential.

In the "Multilayer Deposition" stage 120 W of dc power was applied to the dc electrode establishing a bias of −386 V on the Pt sputtering target. 400 W of rf power was applied to the Co planar magnetron sputter electrode establishing a self-bias of −560 V with regard to ground potential. The substrate table was at a bias of negative 1–2 V with regard to ground potential.

Each of Examples 6A–6D were subjected to hyperthermal treatment as follows:

| 6A | No hyperthermal treatment |
| --- | --- |
| 6B | Hyperthermal treatment of substrate only |
| 6C | Hyperthermal treatment of interlayer only |
| 6D | Hyperthermal treatment of both the substrate and the interlayer. |

The polar Kerr loops for the above are shown in FIGS. 6A–6C and 7 respectively. Clearly, hyperthermal processing of both the substrate and the interlayer gives the best results.

EXAMPLE 7A–7F

The deposition procedure of Example 1A was followed with the following notable adjustments:

During the "Interlayer Deposition" stage for bias grown interlayers the dc power supplied to the electrode was 120 W at −374 V with regard to ground potential whilst 1000 W of rf power was applied to the substrate table. The substrate table was at a bias of approximately −235 V with regard to ground potential during deposition. The table rotating at 6 rpm and making six deposition passes by the Pt dc magnetron sputter electrode. In the absence of rf biasing of the substrate table the total as-deposited Pt interlayer thickness would be approximately 50 Å.

In the "Multilayer Deposition" stage 120 W of dc power was applied to the dc electrode establishing a bias of −386 V on the Pt sputtering target. 400 W of rf power was applied to the Co planar magnetron sputtering target establishing a self-bias of −560 V with regard to ground potential.

The combinations of bias grown interlayers with hyperthermal processing stages in multilayer fabrication and any subsequent post-deposition thermal treatment for the following Examples are shown in the Table below.

TABLE

| Example | S1 | S2 | Post-Deposition Thermal Treatment |
| --- | --- | --- | --- |
| 7A | * | * | |
| 7B | * | — | |
| 7C | — | * | |
| 7D | — | — | |
| 7E | * | * | * |
| 7F | * | — | * |

\* = Process applied
— = Process absent

Where applicable post-deposition thermal treatment was carried out according to the following procedure:

Sample 7E was attached to a platinum bar and heated from 23° C. to 153° C. in 1½ minutes. The sample was maintained at temperature for 30 minutes and then cooled to 23° C. in 4 minutes.

Sample 7F was attached to a platinum bar, and heated from 24° C. to 126° C. in one minute. The sample was left at 126° C. for 30½ minutes, after which it was cooled to 24° C. in 3 minutes.

The Table below shows the room temperature coercivity and Kerr rotation for the above Examples.

TABLE

| Example | $H_c$ (kOe) | θ (°) |
|---|---|---|
| 7A | 5.3 | 0.29 |
| 7B | 4.23 | 0.28 |
| 7C | 5.92 | 0.28 |
| 7D | 3.71 | 0.24 |
| 7E | 7.31 | 0.25 |
| 7F | 4.86 | 0.27 |

EXAMPLE 8

The stages S1, Interlayer Thermal Treatment, S2, Post-Deposition Thermal Treatment, were carried out as indicated below for Examples 8A–8L, following appropriately the procedure of Example 1A.

| Example | S1 | Interlayer Thermal Treatment | S2 | Post-Deposition Thermal Treatment |
|---|---|---|---|---|
| 8A | — | — | — | * |
| 8B | * | — | — | * |
| 8C | — | — | * | * |
| 8D | * | — | * | * |
| 8E | — | * | — | — |
| 8F | * | * | — | — |
| 8G | — | * | * | — |
| 8H | * | * | * | — |
| 8I | — | * | — | * |
| 8J | * | * | — | * |
| 8K | — | * | * | * |
| 8L | * | * | * | * |

Note:
— = process not applied
* = process applied

S1 and S2 were as previously described; the thermal treatment process for the interlayer and/or multilayer is described below:

Interlayer

Samples were placed in a furnace at 180° C. for 50 minutes. They were then removed and placed in Al block to cool. Room temperature was reached in approximately 2 minutes.

Multilayer

Samples were placed in a furnace at 155° C. for 40 minutes, after which they were taken out, placed in a large Al block. Room temperature was reached in approximately 2 minutes.

The results obtained for each sample were as follows:

TABLE

Multilayer Coercivity and Polar Kerr Rotation

| Example: | | | | | | | | | | | |
|---|---|---|---|---|---|---|---|---|---|---|---|
| 8A | 8B | 8C | 8D | 8E | 8F | 8G | 8H | 8I | 8J | 8K | 8L |
| $\theta_k$ (°) | | | | | | | | | | | |
| .11 | .13 | .18 | .30 | .18 | .12 | .25 | .27 | .16 | .09 | .22 | .24 |
| $H_c$ (kOe) | | | | | | | | | | | |
| 1.42 | 2.73 | 3.08 | 5.4 | .78 | .83 | 1.64 | 2.09 | .32 | .41 | 1.64 | 2.48 |

The polar Kerr loops for the above examples are shown in FIGS. 8A–8L respectively.

From the results it can be seen that at least one of S1 or S2 is essential while both are preferable; and a post-deposition thermal treatment as well, is particularly advantageous.

EXAMPLE 9A

The procedure of Example 1A was followed with the following notable adjustments:

In "hyperthermal treatment S1" 700 W of rf power was applied for 20 minutes, the table speed remaining at 6 rpm, a bias of −200 V was developed on the substrate table with respect to ground potential.

A Pt interlayer approximately 50 Å thick was deposited as in Example 1A except 6 sequential deposition passes were used.

The argon gas pressure remained at $1.5 \times 10^{-2}$ mb throughout all processing stages.

After deposition of the magneto-optic film the substrate was removed from the chamber and thermally treated according to the following process.

The sample was heated in two cycles.

First cycle

The sample was attached to an Al block and heated stepwise from 17° C. to 51° C. to 100° C. to 146° C. to 176° C. approximately using halogen light bulbs which heated the block. The sample was maintained at each intermediate temperature for approximately 3 minutes. The temperature of the sample was maintained at 176° C. for 15 minutes after which the sample was allowed to cool to room temperature.

Second cycle

The sample was attached to an Al block and heated stepwise from 18° C. to 50° C. to 98° C. to 146° C. to 182° C. approximately using halogen light bulbs which heated the block. The sample was maintained at each intermediate temperature for approximately 3 minutes. The temperature of the sample was maintained at 182° C. for 14 minutes after which the sample was allowed to cool to room temperature.

Figure 9:
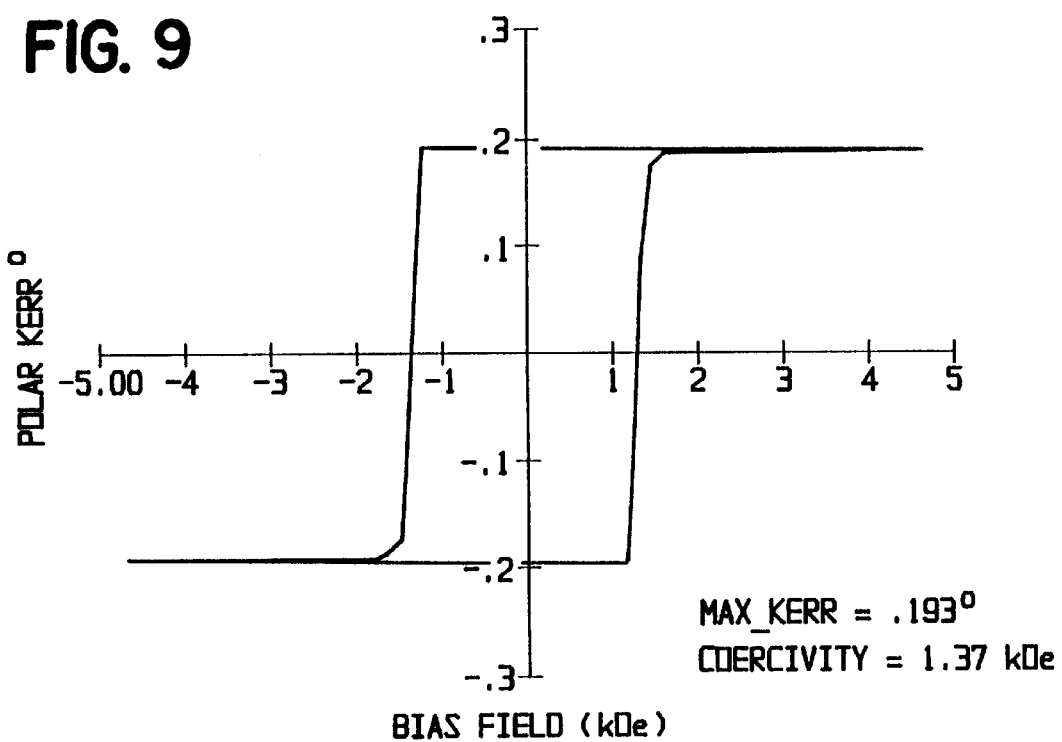
FIGS. 9 and 9A illustrate data from Example 9A.
Figure 9A:
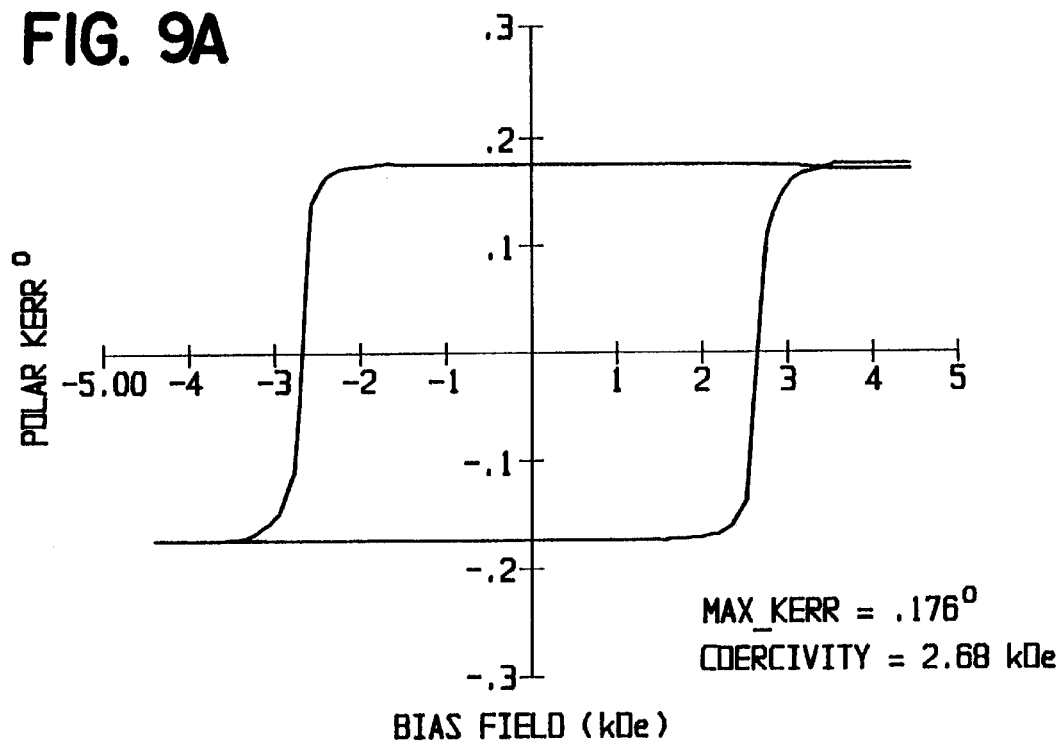
Figure 9D:
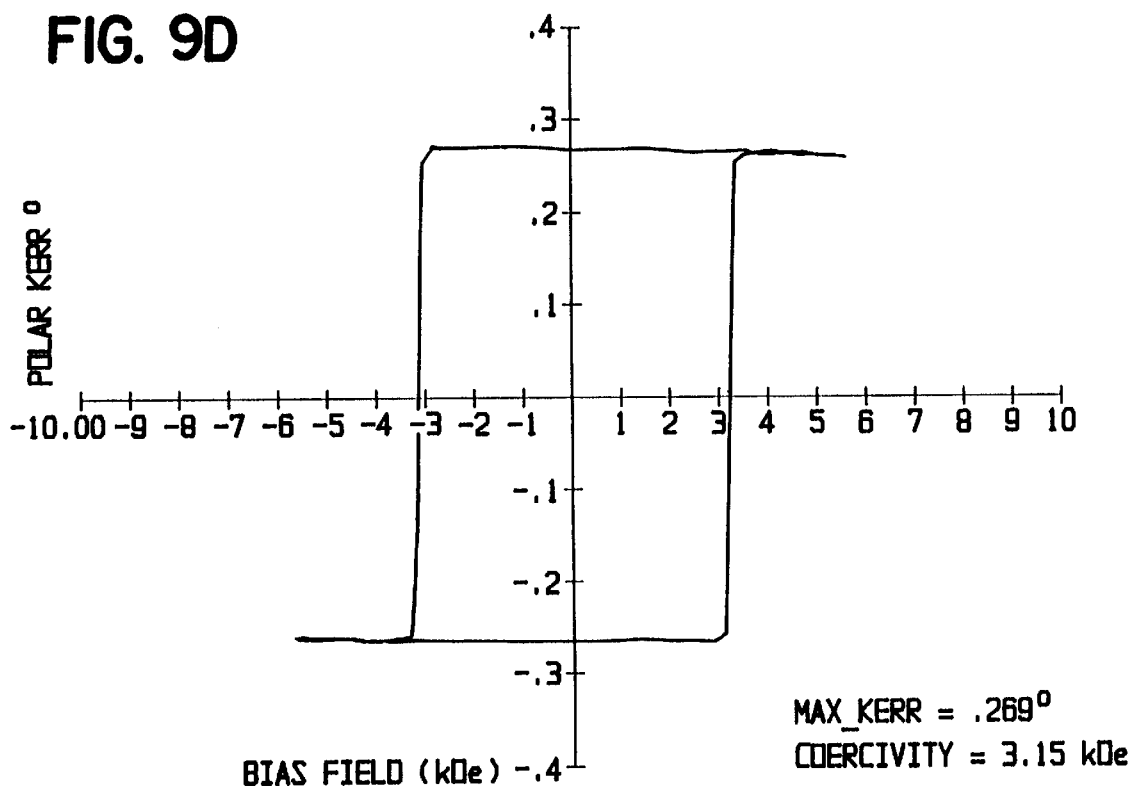
FIGS. 9D, 9E, 9F, 9G and 9H illustrate data from Example 9C.
Figure 9E:
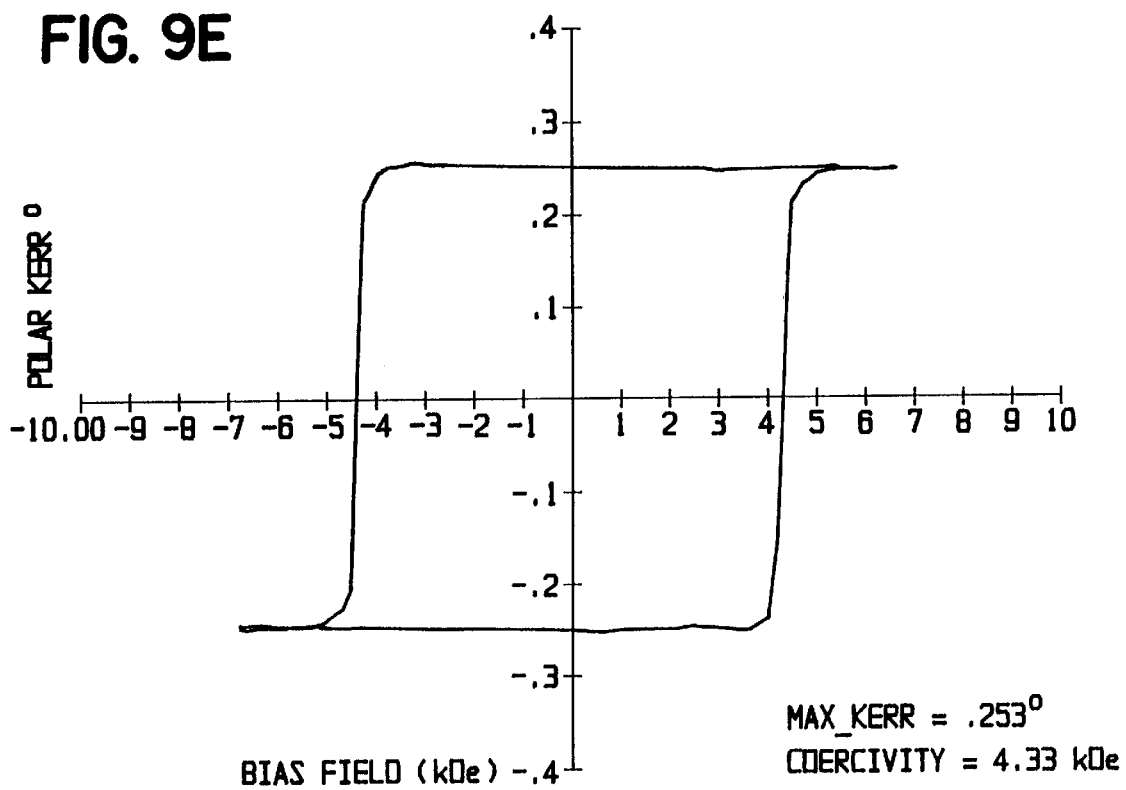
Figure 9F:
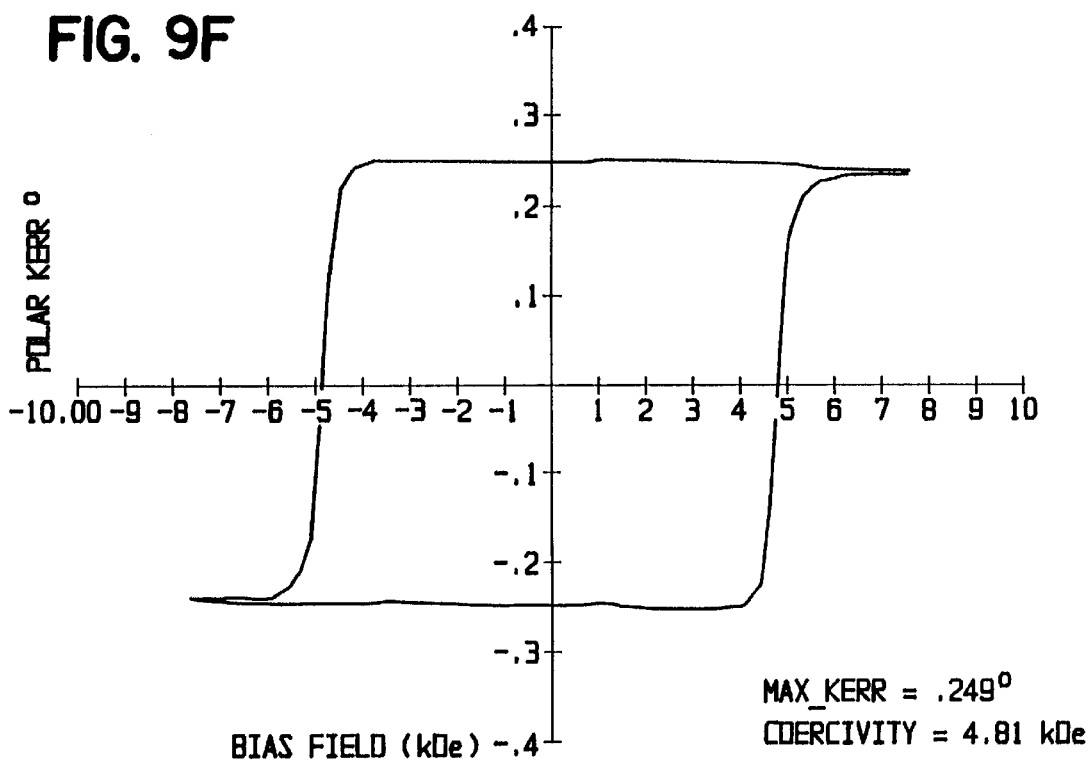
Figure 9G:
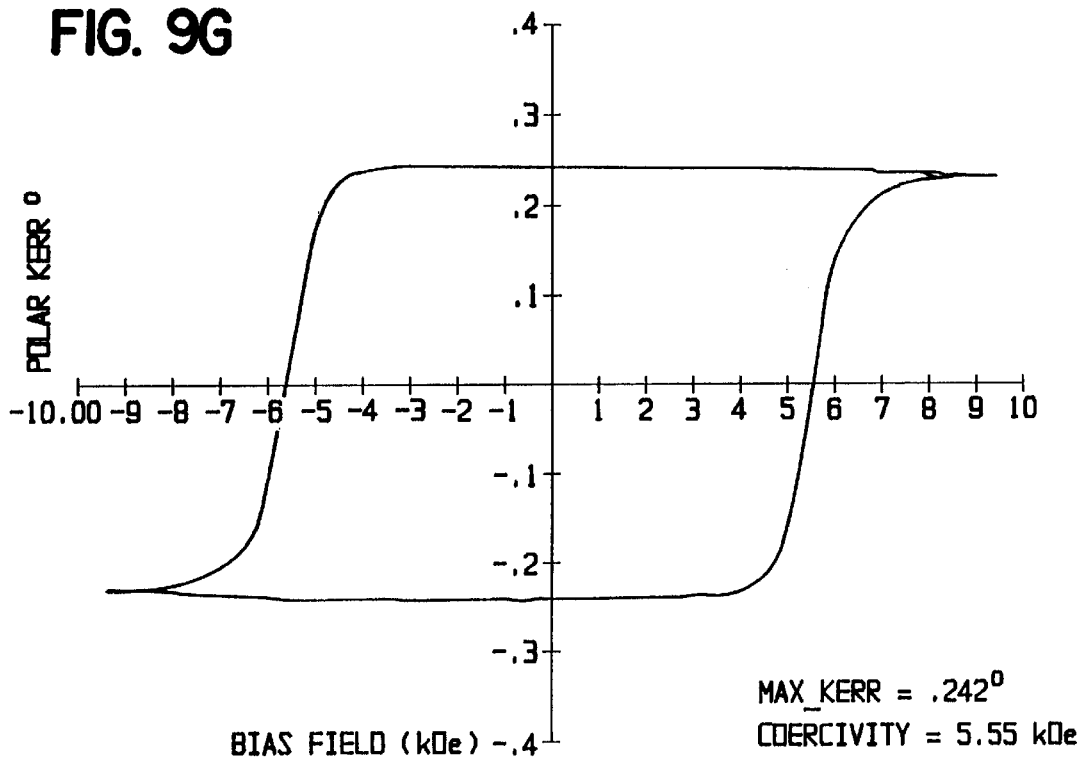
Figure 9H:
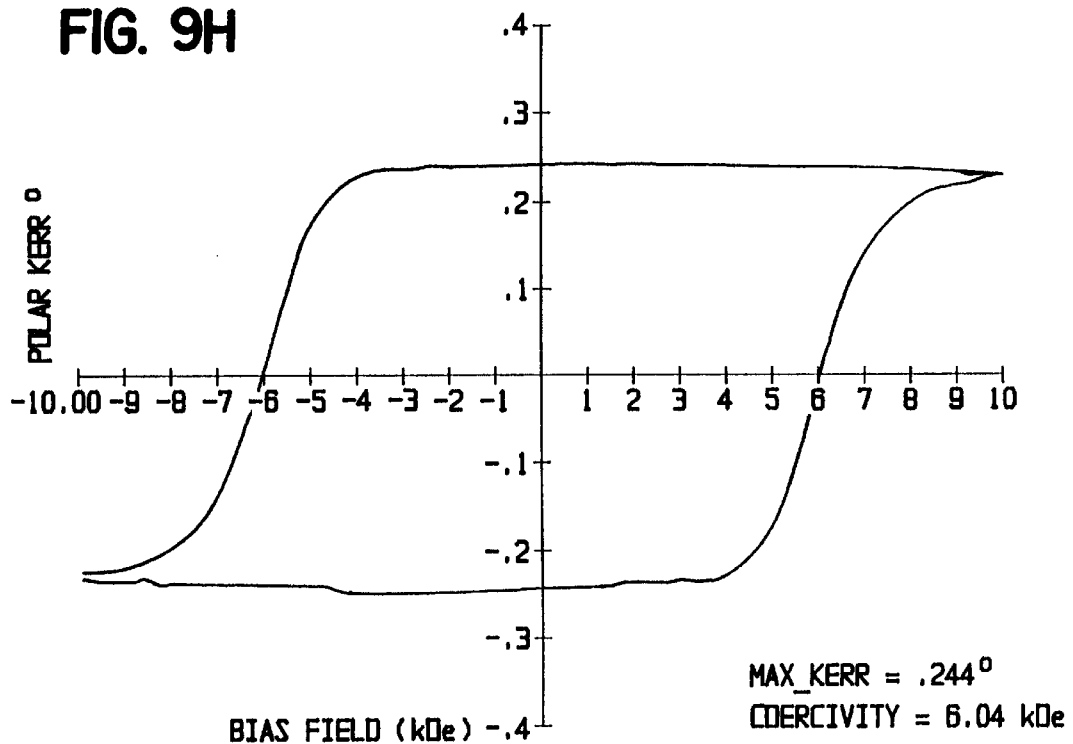

FIGS. 9 and 9A show the polar Kerr loop for the as-deposited and thernally-treated sample, measured through the magneto-optic film.

The properties obtained were:

|  | Before thermal treatment | After thermal treatment |
|---|---|---|
| $\theta_k$ (°) | .193 | .176 |
| $H_c$ (kOe) | 1.37 | 2.68 |

EXAMPLE 9B

The procedure of Example 1A was followed with the following notable adjustments:

The substrate was Pilkington optical data storage disc glass.

After deposition of the magneto-optic film the substrate was removed from the chamber and thermally treated according to the following process. The sample was placed in a furnace at 140° C. for 60 minutes; then removed from the furnace and allowed to cool to room temperature.

FIG. 9B and 9C show the polar Kerr loop for the as-deposited and thermally-treated sample measured through the magneto-optic film.

The properties obtained were as follows:

|  | Before thermal treatment | After thermal treatment |
|---|---|---|
| Polar Kerr rotation | .316° | .281° |
| Coercivity | 3.58 kOe | 5.2 kOe |

EXAMPLE 9C

The procedure of Example 1A was followed with the following notable adjustments:

The substrate was a glass microscope slide.

After deposition of the magneto-optic film the substrate was removed from the chamber and thermally treated according to the following four-stage process.

Stage 1

The sample was placed in a furnace at 140° C. for 60 minutes, removed, and allowed to cool to room temperature.

Stage 2

Stage 1 was repeated.

Stage 3

The sample was placed first in a furnace at 140° C. for 81 minutes, then in the furnace for 64 minutes, and finally in the furnace for 64 minutes. In between each furnace stage and after the last furnace stage, the sample was allowed to cool to room temperature.

Stage 4

The sample was given four heat treatments in a furnace at 140° C.: firstly for 64 minutes, then for 81 minutes, 60 minutes and 169 minutes. As before, in between each furnace stage, and after the final furnace stage, the sample was allowed to cool to room temperature.

FIGS. 9C, 9D, 9E, 9F, 9G, and 9H show polar Kerr loops for the as-deposited sample and after the sample was subjected to successive heat treatments as described above. The sample was measured through the magneto-optic film.

The properties obtained were as follows:

|  | Room temperature coercivity | Polar Kerr rotation (°) |
|---|---|---|
| As-deposited | 3.15 | .269 |
| After treatment |  |  |
| (1) | 4.33 | .253 |
| (2) | 4.81 | .249 |
| (3) | 5.55 | .242 |
| (4) | 6.04 | .244 |

From the results above it may be concluded that at least one heat treatment is advantageous to magneto-optic properties. However, after heat treatments (3) and (4) above, coercivity is increased at the expense of the squareness of the polar Kerr hysteresis loop.

EXAMPLE 10A

The procedure of Example 1 was followed with the following adjustments:

The substrate was a Pilkington optical data storage disc glass.

In the "Target pre-conditioning" stage, 120 W of dc power was applied.

During the "Interlayer Deposition" stage the dc power supplied to the electrode was 120 W at −406 V with regard to ground potential.

In the "Multilayer Deposition" stage 120 W of dc power was applied to the dc electrode establishing a bias of −406 V on the Pt sputtering target.

After deposition the sample was subjected to the thermal treatment process described below:

The sample was heated in air at atmospheric pressure using two 250 W halogen light bulbs, (Osram Ltd catalogue number 250–075); half the bulb envelope was gold plated. The distance from the sample surface to the bulb filaments was approximately 38 mm.

The bulbs were switched on for 38 seconds and then cycled for 18 seconds, at a frequency of 1.43 Hz with a pulse duration of 0.21 seconds. The samples were then placed on an Al block, after 2 minutes the temperature of the sample had fallen to room temperature.

Figure 10E:
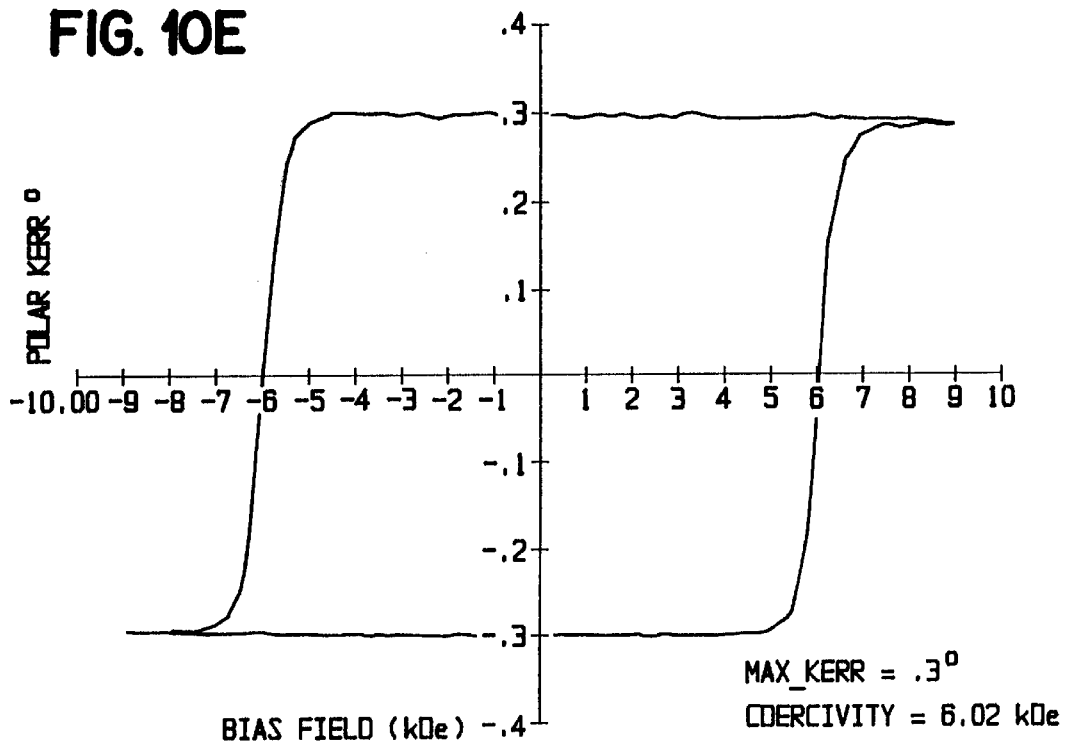
FIGS. 10D, 10E and 10F illustrate data from Example 10C.
Figure 10A:
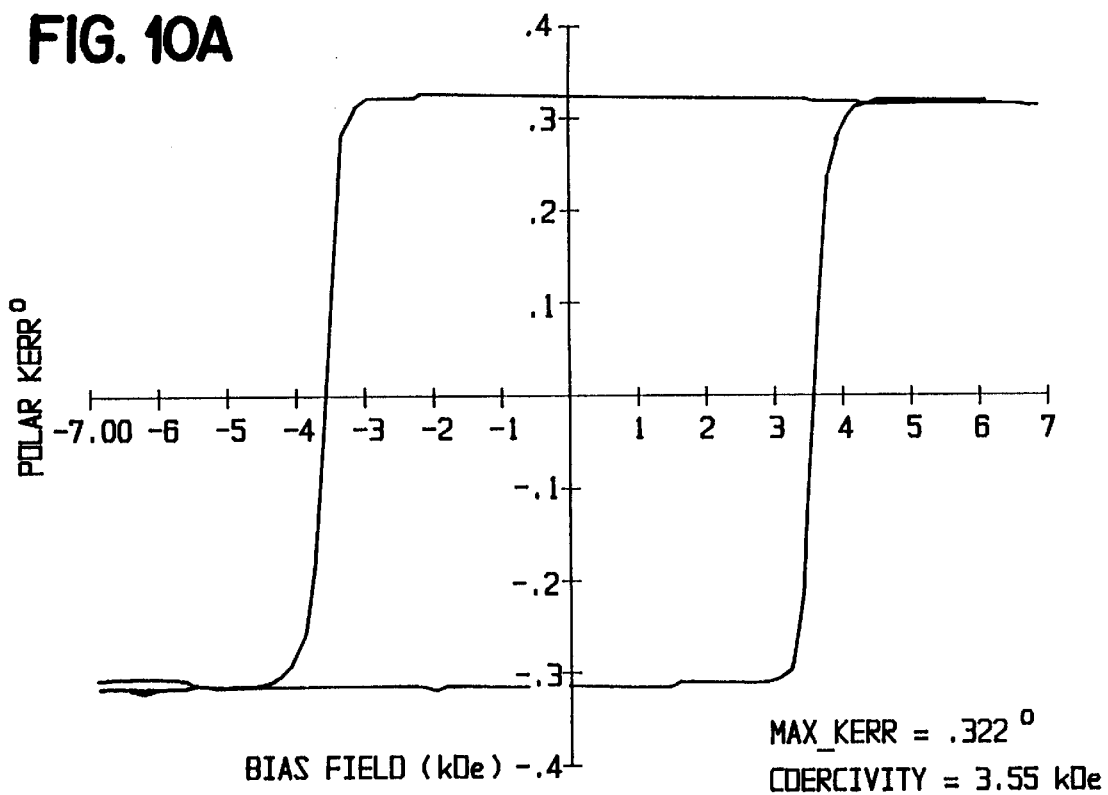
FIGS. 10 and 10A illustrate data from Example 10A.
Figure 10:
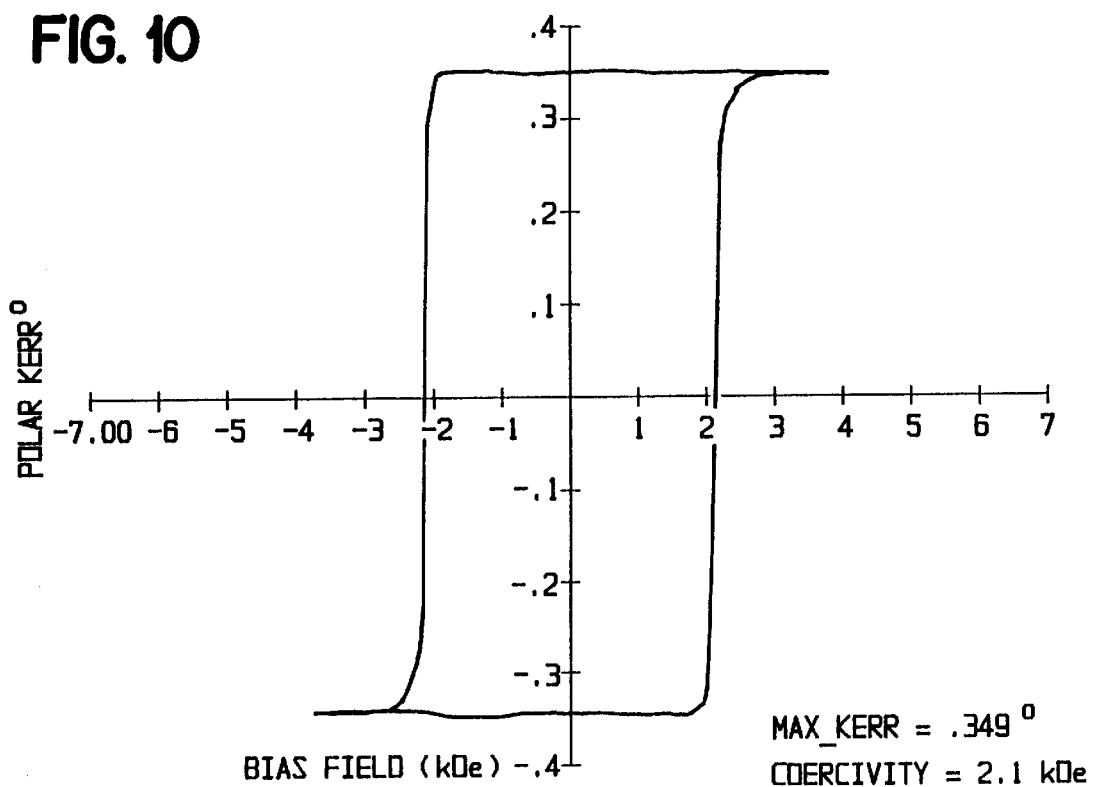

FIGS. 10 and 10A show the polar Kerr rotation at room temperature square loop coercivity before and after thermal treatment for the sample described above.

The properties obtained were as follows:

|  | Before thermal treatment | After thermal treatment |
|---|---|---|
| Room temperature coercivity (kOe) | 2.1 | 3.55 |
| Polar Kerr rotation (°) | .349 | .322 |

EXAMPLE 10B

The procedure of Example 10A was followed with the following notable adjustments:

In the "Gas Equilibration 2" stage the argon gas pressure was adjusted to $2.5 \times 10^{-2}$ mb.

In the "Multilayer Deposition" stage 120 W of dc power was applied to the dc electrode establishing a bias of −389 V on the Pt sputtering target. 400 W of rf power was applied to the Co target establishing a self-bias of −580 V with regard to ground potential.

After deposition the sample was subjected to the thermal treatment described below:

The sample was heated as in Example 10A with the exception that the bulbs were switched on for 32 seconds and then cycled for 40 seconds in manner described in Example 10A.

Figure 10B:
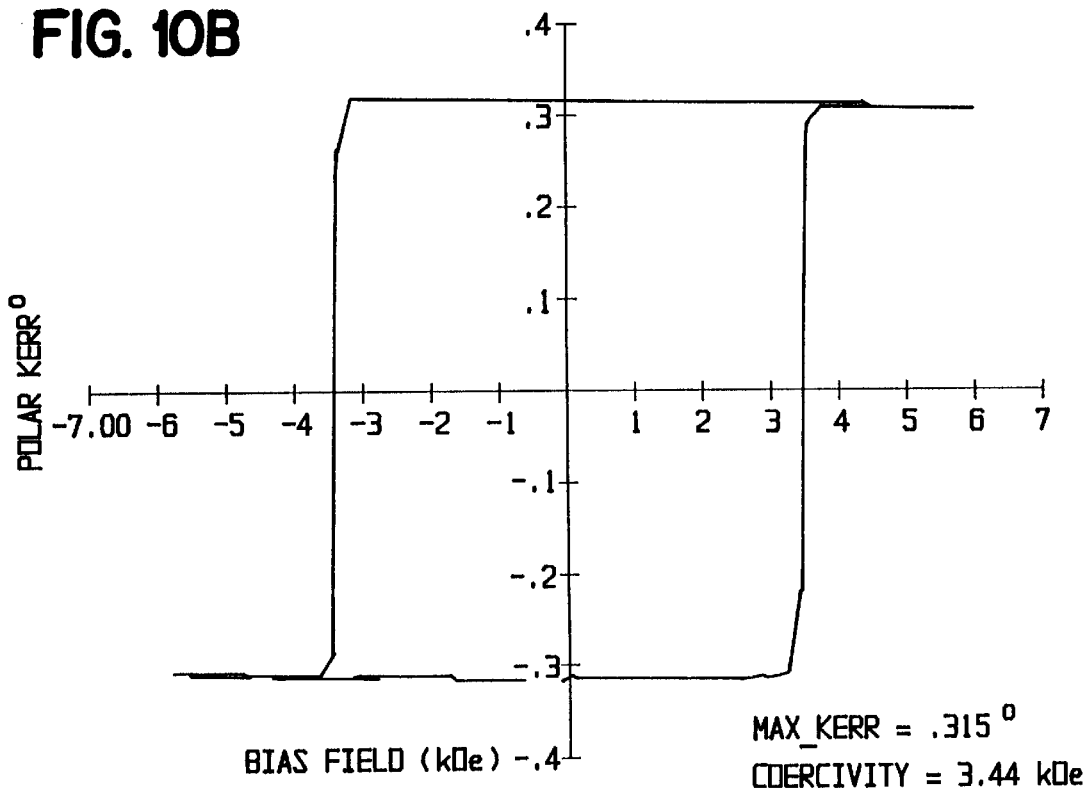
FIGS. 10B and 10C illustrate data from Example 10B.
Figure 10C:
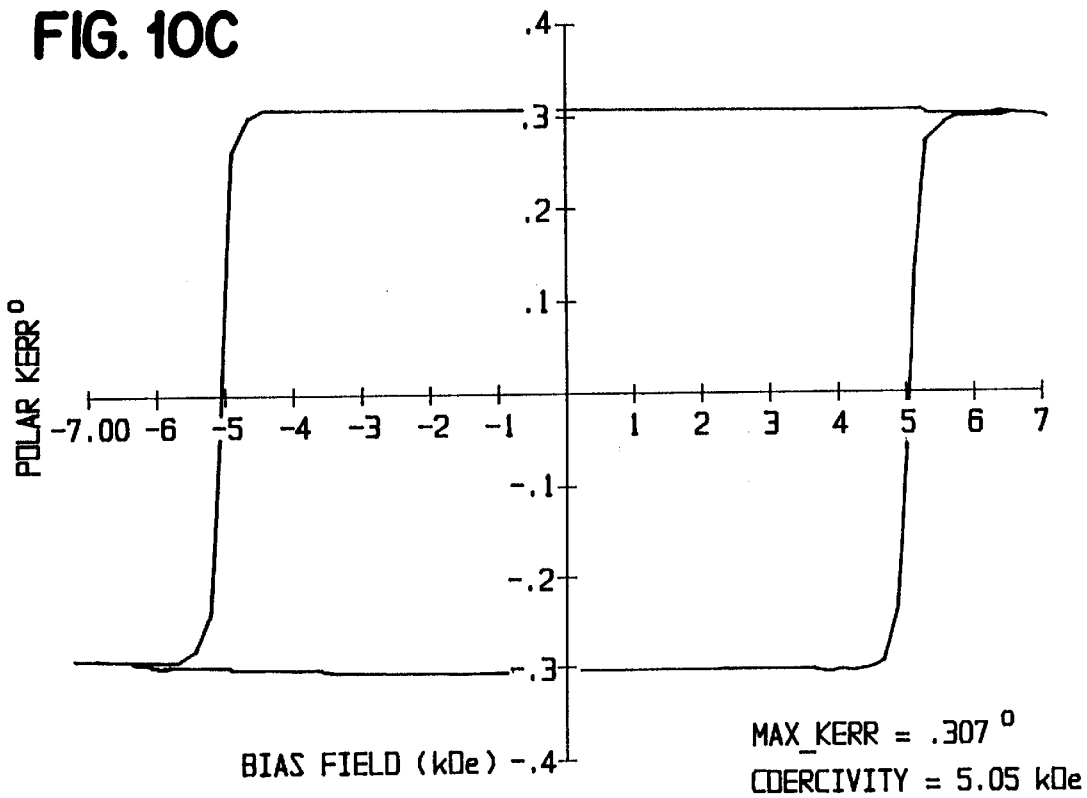

FIGS. 10B and 10C show the polar Kerr rotation and room temperature square loop coercivity before and after thermal treatment for the sample described above.

The properties obtained were as follows:

|  | Before thermal treatment | After thermal treatment |
| --- | --- | --- |
| Room temperature coercivity (kOe) | 3.44 | 5.05 |
| Polar Kerr rotation (°) | .315 | .307 |

EXAMPLE 10C

The procedure of Example 10B was followed with the following notable adjustments:

The substrate was a glass microscope slide.

After deposition the sample was subjected to the thermal treatment process described below:

The sample was heated as in Example 10A with the exception that the bulbs were switched on for 35 seconds and then cycled for 45 seconds in the manner described in Example 10A.

Figure 10D:
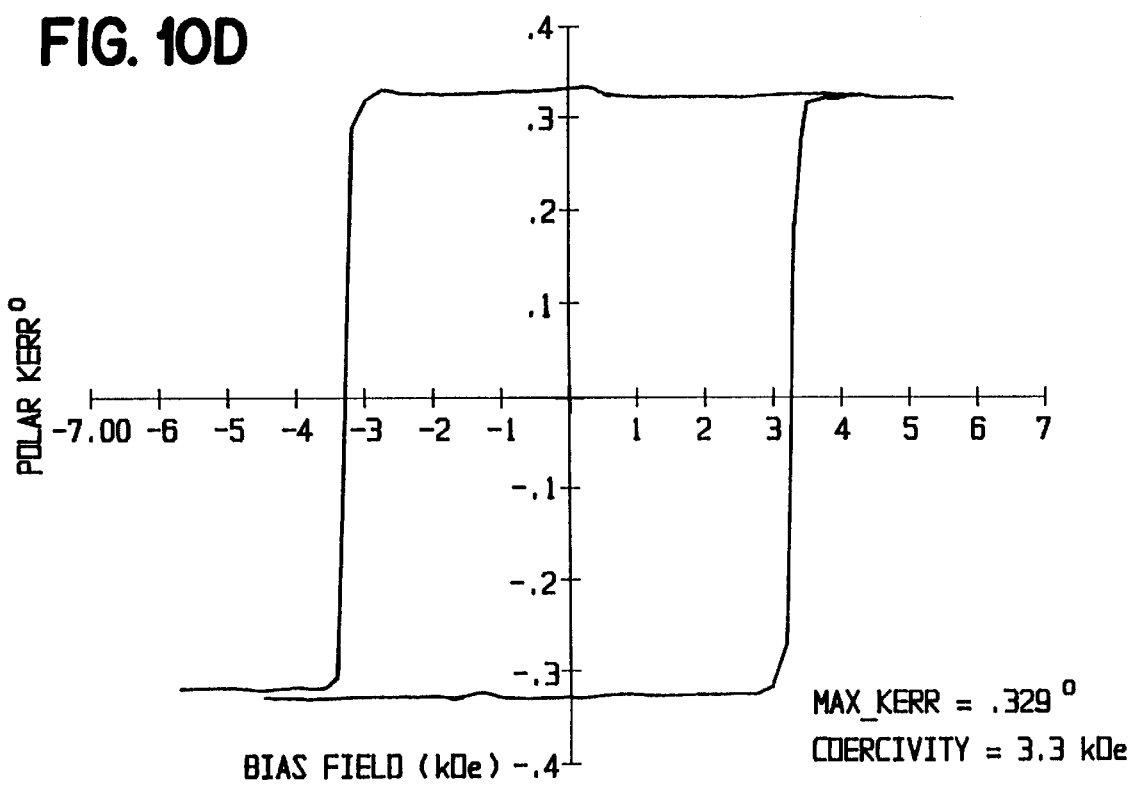
Figure 10F:
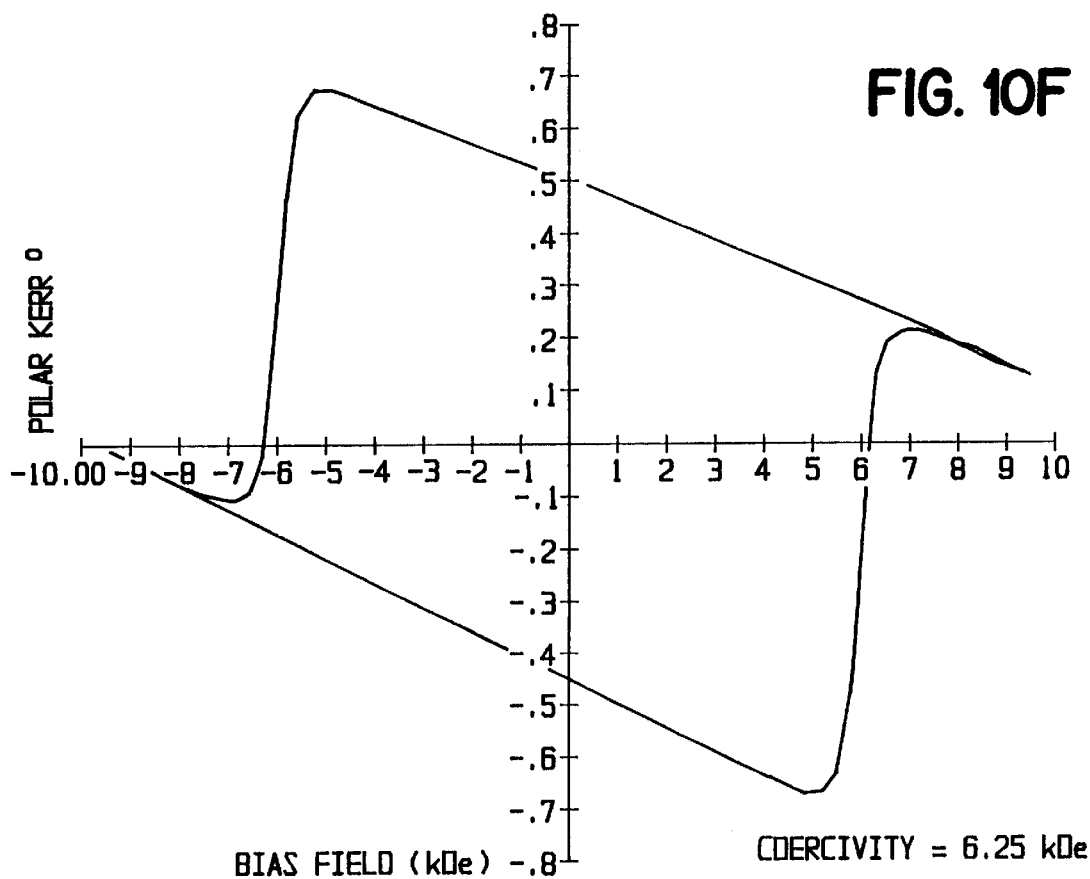

FIGS. 10D, 10E and 10F show the polar Kerr rotation and room temperature square loop coercivity and nucleation field before and after thermal treatment processing and showing also through the substrate optical interrogation for the sample described above.

The properties obtained were as follows:

|  | Before thermal treatment | After thermal treatment |
| --- | --- | --- |
| Room temperature coercivity (kOe) | 3.3 | 6.02 |
| Polar Kerr rotation (°) | .329 | .3 |

EXAMPLE 11

The procedure of Example 10C was followed with the following notable adjustments:

In the "Multilayer Deposition" stage 15 layers of approximately 15 Å Pt each and approximately 3 Å Co each were deposited sequentially the first and last being Pt in 7.5 table rotations at 6 rpm. 215 W of constant dc power was supplied to the Pt magnetron sputter electrode which was biased to −422 V with regard to ground potential. 400 W of rf power was supplied to the Co magnetron sputtering electrode establishing a self-bias of −580 V with regard to ground potential. The substrate was at a negative potential of 1–2 V with regard to ground potential.

After deposition the sample was subjected to the thermal treatment process described below:

The sample was placed in a furnace at 153° C. for 40 minutes, then removed from the furnace and placed on an Al block; after 2 minutes the sample temperature had fallen to room temperature.

Figure 11:
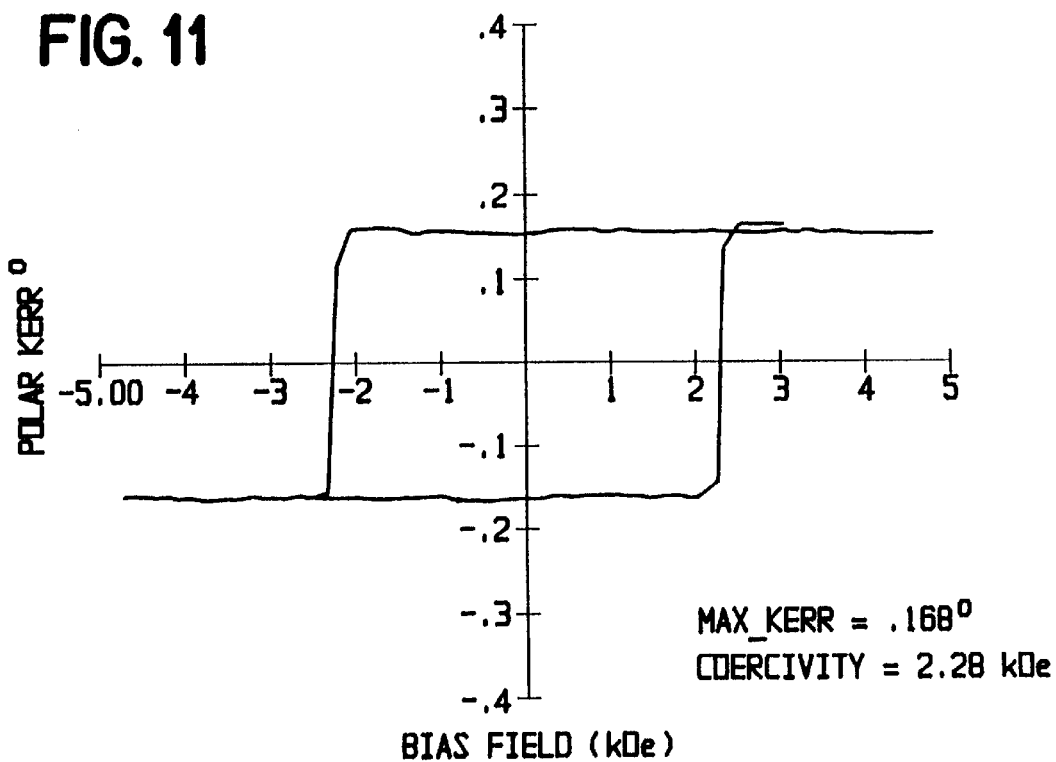
FIG. 11 illustrates data from Example 11 for a sample before thermal processing.
Figure 12:
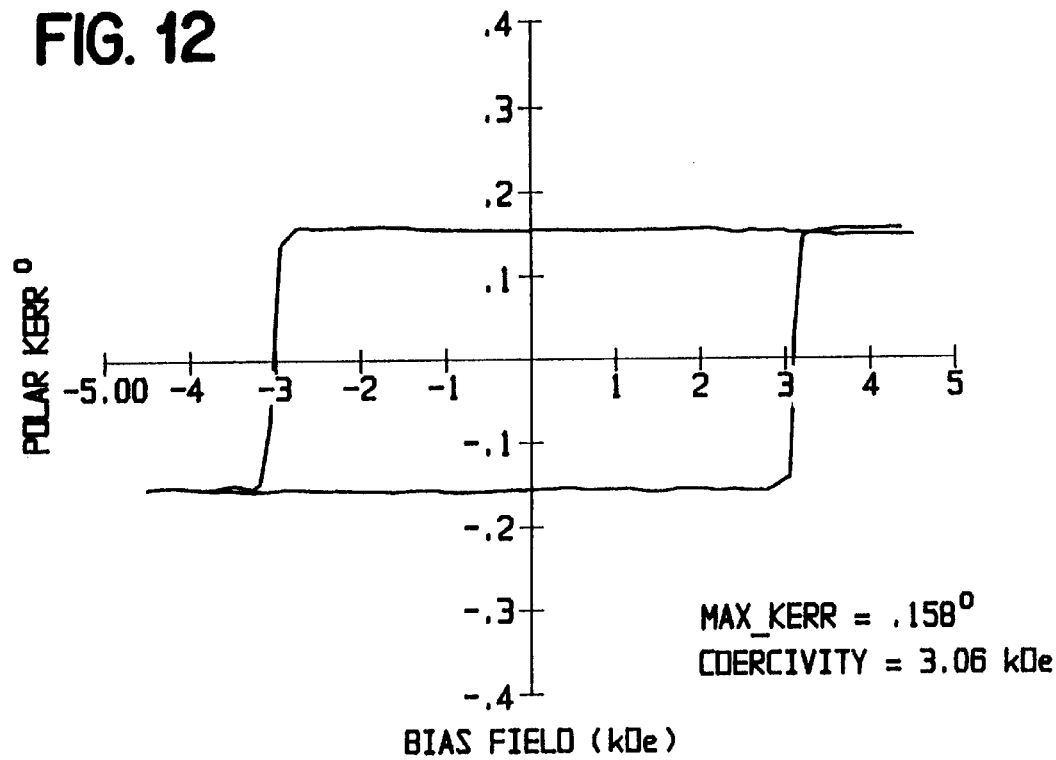
FIG. 12 illustrates data from Example 11 for a sample after thermal processing.

FIGS. 11 and 12 show the polar Kerr rotation and room temperature square loop coercivity and nucleation field before thermal processing and after thermal processing for the sample described above.

The properties obtained were as follows:

|  | Before thermal treatment | After thermal treatment |
| --- | --- | --- |
| Room temperature coercivity (kOe) | 2.28 | 3.06 |
| Polar Kerr rotation (°) | .168 | .158 |

EXAMPLES 12A–E

For Examples 12A–B

The procedure of Example 1 was followed with the following process modifications:

The substrate was $SiO_2$ for Example 12A and Si in Example 12B.

In "Hyperthermal S1" stage the substrate table was rotated at 6 rpm for 20 minutes whilst 700 W of rf power was applied establishing a bias fo −200 V with regard to ground potential on the substrate table.

In the "Interlayer Deposition" stage an approximately 50 Å Pt interlayer was established in six deposition passes.

For Examples 12C,D,E

The procedure of Example 1A was followed with the following notable adjustments:

The substrate was $Si_3N_4$ in Examples 12C and E, and Si in Example 12D.

In the "Target pre-conditioning" stage, 120 W of dc power was applied.

During the "Interlayer Deposition" stage the dc power supplied to the electrode was 120 W at −406 V with regard to ground potential.

In the "Multilayer Deposition" stage 120 W of dc power was applied to the dc electrode establishing a bias of −384 V on the Pt sputtering target. 400 W of rf power was applied to the Co magnetron sputter electrode establishing a self-bias of −575 V with regard to ground potential.

Examples 12A–E were post-deposition heat treated according to the following procedure:

Example 12A

The sample was heated using one 300 W halogen light bulb, similar to those in Example 10A, except the bulb envelope was not gold plated. The distance from the sample surface to the bulb filament was approximately 20 mm. The bulbs were switched on for 30 seconds and then cycled for 60 seconds at a frequency of 1.43 Hz and a pulse duration of 0.21 seconds.

The bulb was then switched off and after 20 minutes the sample was removed from under the bulb and cooled to room temperature in water.

Example 12B

The sample was attached to an Al block and heated stepwise from 23° C. to 85° C. to 116° C. to 151° C. to 180° C. approximately using halogen light bulbs which heated the block. The sample was maintained at each intermediate temperature for approximately 3 minutes. The sample was maintained at 180° C. for 33 minutes after which it was allowed to cool to room temperature.

Example 12C

The sample was attached to an Al block and heated stepwise using halogen light bulbs which heated the block. The Table below indicates heating details.

TABLE

| Time (mins) | Temperature (°C.) |
|---|---|
| 0 | 21 |
| 0–5 | 21–75 |
| 5–8 | 75 |
| 8–14 | 75–120 |
| 14–17 | 120 |
| 17–20 | 120–151 |
| 20–29 | 151 |
| 29–30 | 151–165 |
| 30–44 | 165 |
| 44–47 | 165–145 |
| 47–54 | 145–104 |
| 54–150 | 104–21 |
| 150 | 21 |

Example 12D

The sample was heated as in Example 10A with the following exceptions: the distance from the sample surface to the bulb filaments was 35 mm, and the bulbs were switched on for 90 seconds and then cycled for 60 seconds at a frequency of 1.43 Hz with a pulse duration of 0.72 seconds.

Example 12E

The sample was treated as in Example 12D.

Table 12 shows the room temperature nucleation field, coercivity and Kerr rotations derived from polar Kerr loop traces for the samples described above before and after thermal treatments.

TABLE

| Example | $H_c$ (kOe) | $H_n$ (kOe) | $\theta k$ (°) |
|---|---|---|---|
| As-deposited: | | | |
| 12A | 1.21 | 1.14 | 0.1 |
| 12B | 1.13 | 1.05 | 0.1 |
| 12C | 3.19 | 3.11 | 0.19 |
| 12D | 3.29 | 2.92 | 0.15 |
| 12E | 3.07 | 2.92 | 0.21 |
| Thermally treated: | | | |
| 12A | 2.1 | 1.97 | 0.11 |
| 12B | 2.04 | 1.94 | 0.09 |
| 12C | 4.79 | 4.54 | 0.18 |
| 12D | 4.84 | 4.69 | 0.14 |
| 12E | 4.39 | 4.23 | 0.18 |

EXAMPLE 13

The procedure of Example 1A was followed for the preparation of the multilayer structures.

The samples were thermally treated as in Example 7E; but in atmospheres described in the Table below.

Results were as follows:

| Example | Ambient | Pressure (mb) | As-deposited Coercivity | Thermally Treated Coercivity |
|---|---|---|---|---|
| 13A | Air | 1013 | 3.51 | 5.24 |
| 13B | Air | 2.0 | 3.24 | 3.92 |
| 13C | Air | $3.5 \times 10^{-2}$ | 3.36 | 3.20 |
| 13D | $N_2$ | 1013 | 3.55 | 3.52 |
| 13E | He | 1013 | 3.29 | 3.10 |
| 13F | 95% He 5% $O_2$ | 1013 | 3.05 | 4.52 |
| 13G | 10% $H_2$ 90% $N_2$ | 1013 | 3.22 | 2.55 |

EXAMPLE 14

Properties obtained were

Square polar Kerr hysteresis loop

Room temperature coercivity 1.67 kOe

Polar Kerr rotation 0.07

A pre-cleaned glass substrate was mounted onto a substrate table in the vacuum chamber, and the chamber pumped to a base pressure of $2.7 \times 10^{-6}$ mb.

Pure Ar gas was metered into a pumped chamber to attain a pressure of $1.5 \times 10^{-2}$ mb and the system allowed to equilibrate for several minutes. ("Gas Equilibration I").

The octagonally-faced substrate table of total surface area 2960 cm² was situated 11 cm from the palladium sputter source and 11 cm form the cobalt sputter source and rotated at 6 rpm, whilst 1000 watts of constant rf power at 13.56 MHz was applied for 7 minutes to the table, equivalent to 0.34 Wcm⁻², established the table at a negative bias of approximately 265 V with respect to ground potential. ("Hyperthermal Treatment S1").

With the substrate table obscured by shutters from a planar magnetron source fitted with an 8"×4" Pd target, 155 W of dc power was applied to the sputter source for several minutes, to clean the sputter target and establish a steady state of operation ("Target Pre-conditioning stage").

The Pd interlayer was then deposited by five sequential passes by the Pd sputter source, establishing a total thickness of approximately 50 Å, The power supplied to the sputter electrode was 155 W, the electrode bias was −353 V with regard to ground potential. The substrate was at a negative potential of 15 to 18 V with regard to ground potential. The substrate to target separation was 11 cm and the table was rotated at 6 rpm ("Pd Interlayer Deposition").

The surface of the Pd interlayer was then hyperthermally treated by applying rf power (13.56 MHz) to the substrate table. 200 W of rf power was applied for a period of 5 minutes, establishing a table bias with regard to ground potential of −110 V, the substrate table rotating at 6 rpm ("Hyperthermal Treatment S2").

The Ar gas pressure was adjusted to $2.5 \times 10^{-2}$ mb.

The source of Co flux for the production of the desired multilayer structure was provided by a rf planar magnetron source located directly opposite but facing a dc planar magnetron Pd source. The flux from either source was obscured by the substrate table positioned between them. A thin cobalt target was used (8"×4"×1 mm) to enhance the magnetron sputtering effect. With the substrates obscured from both sputter sources, power was applied to each source at the value required for the respective deposition rates of Pd or Co respectively, for fabrication of the multilayer structure. This situation was maintained for several minutes enabling equilibration of the sputter sources at the respective power settings for the required deposition rates ("Target Pre-conditioning Prior to Multilayer Deposition").

The shuttering obscuring the substrate table was removed such that the flux from both sources was incident at the table, and the substrates rotated past the sources producing an alternating structure of Pd and Co layers, the first and last layers being Pd, a structure of 17 layers in total in 8.5 table rotations, was achieved. The table rotation was 6 rpm, and constant rf power applied to the cobalt sputter electrode to achieve a deposition of approximately 3 Å thick Co layer per substrate pass. Constant dc power applied to the Pd sputter electrode achieved approximately a 9 Å thick Pd layer per pass. ("Multilayer Deposition").

140 W of dc power was applied to the Pd sputter electrode, establishing a bias of −320 V on the Pd target. 400 W of rf power was used to establish a self-bias of −570 V with regard to ground potential on the Co target. The substrate was at a negative potential of 5 V with respect to ground potential.

Figure 13:
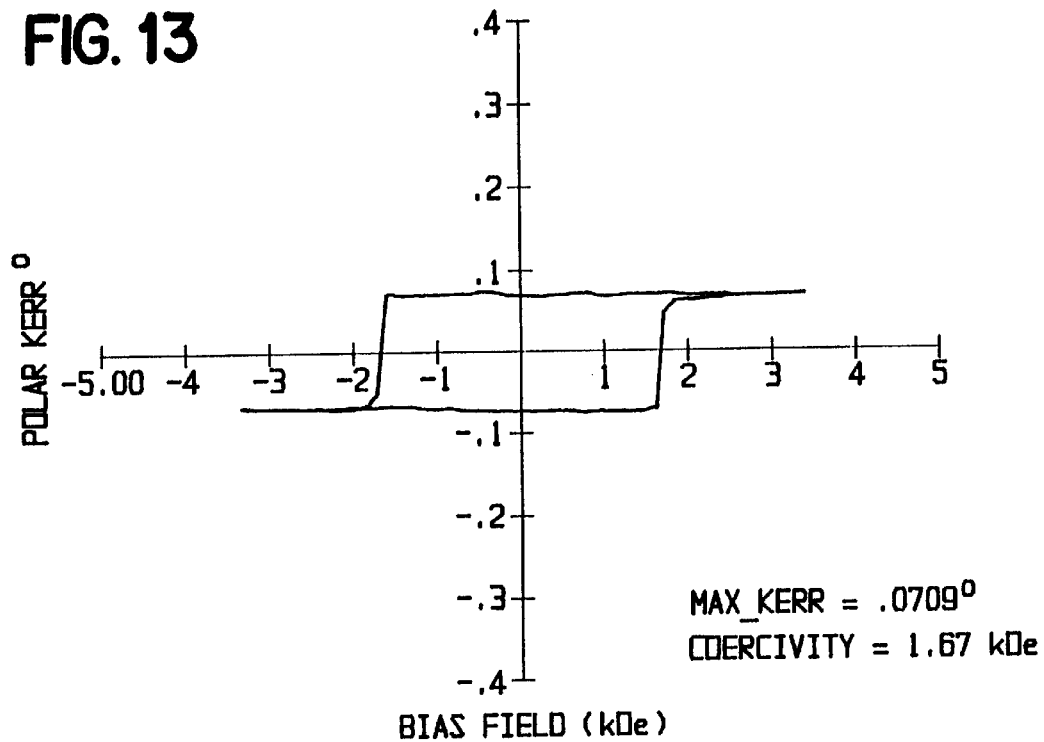
FIG. 13 illustrates data from Example 14.
Figure 6A:
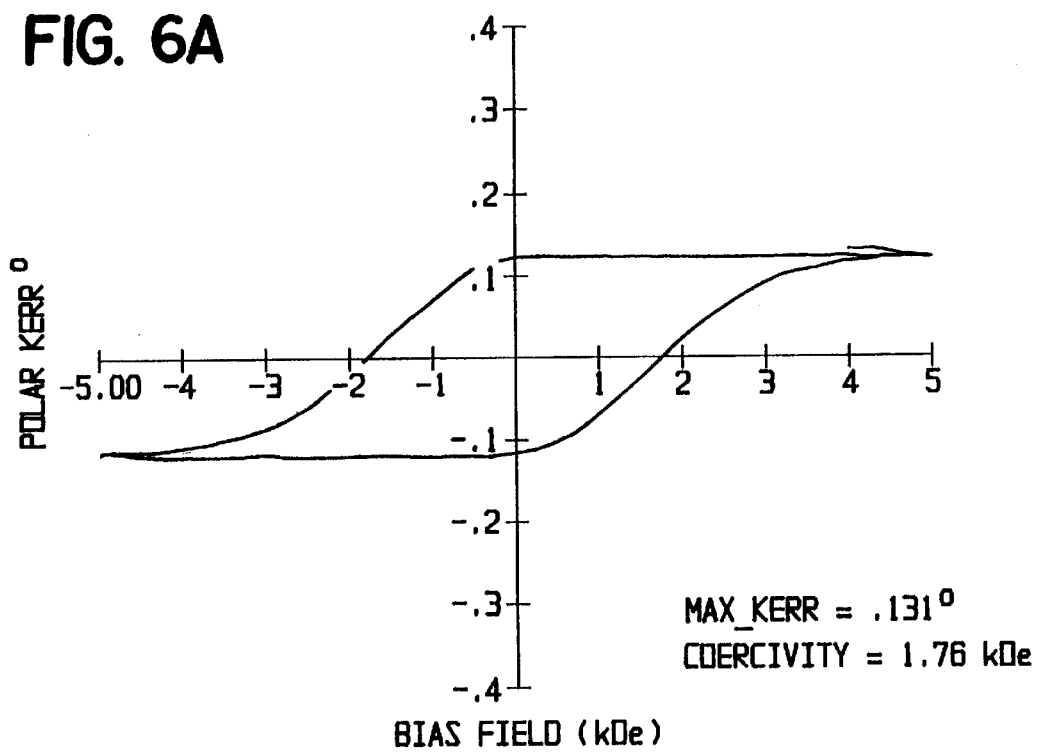
Figure 6B:
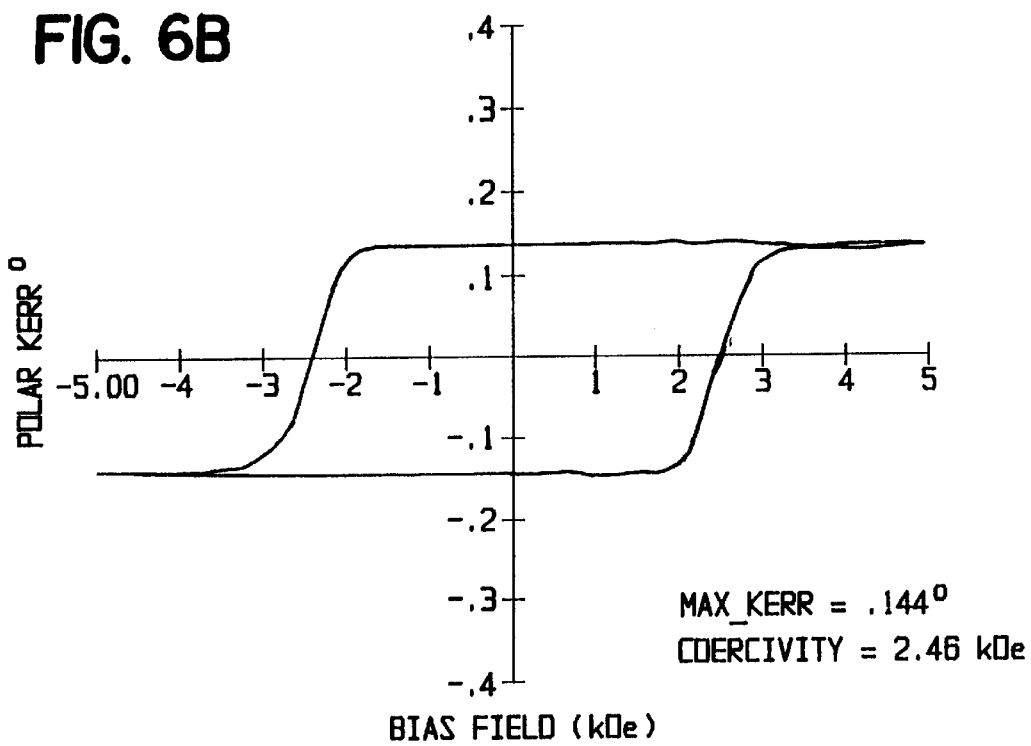
Figure 8E:
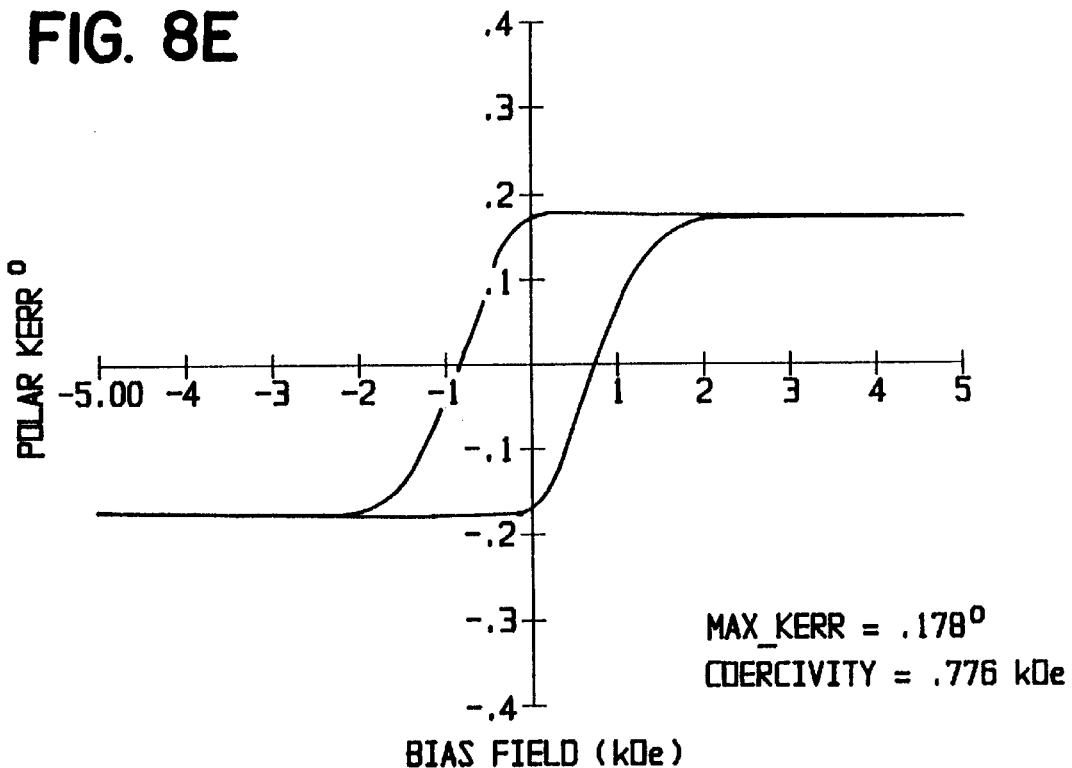
Figure 8F:
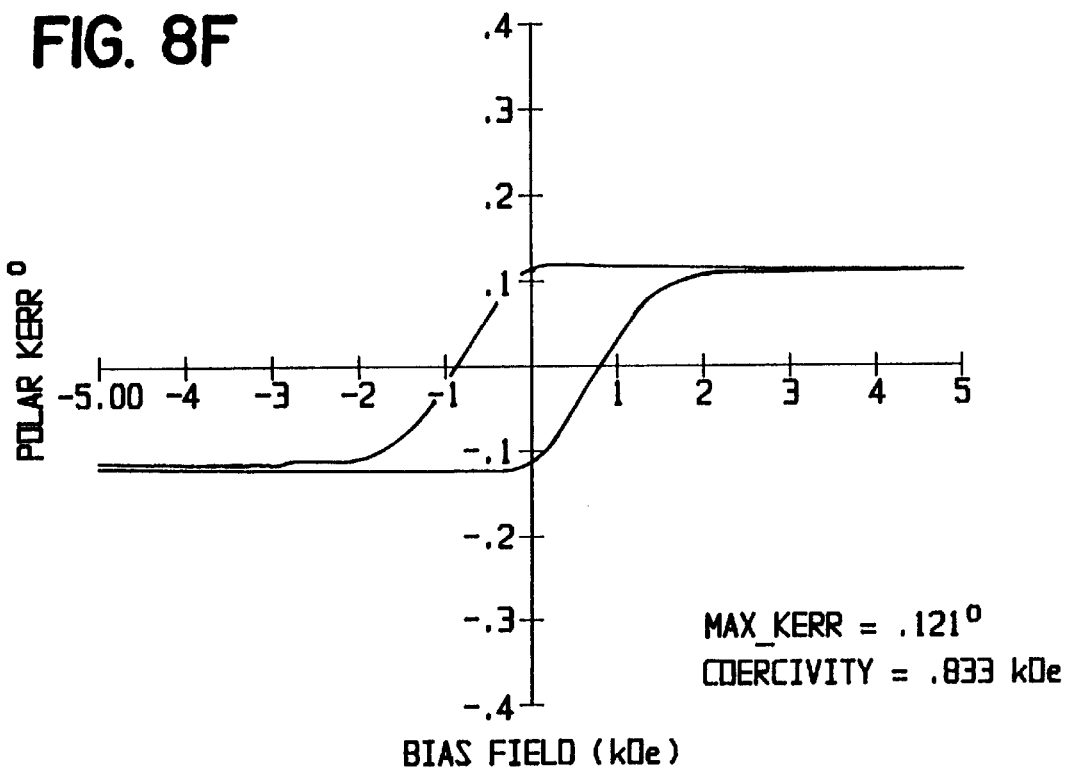
Figure 8G:
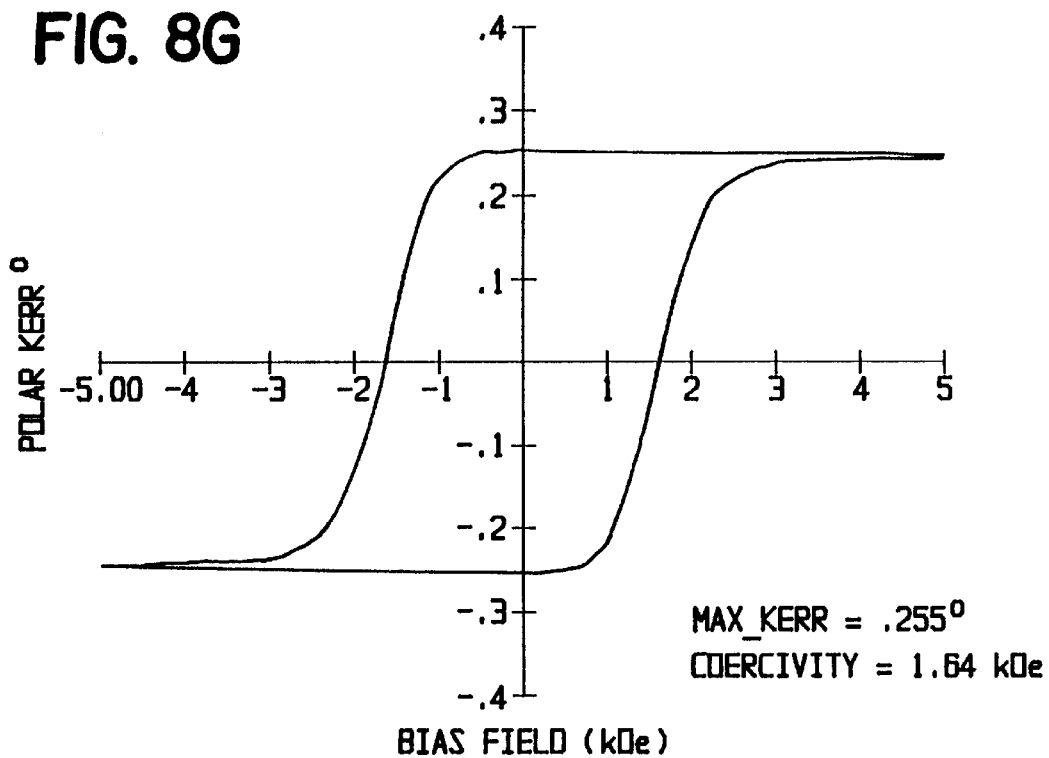
Figure 8H:
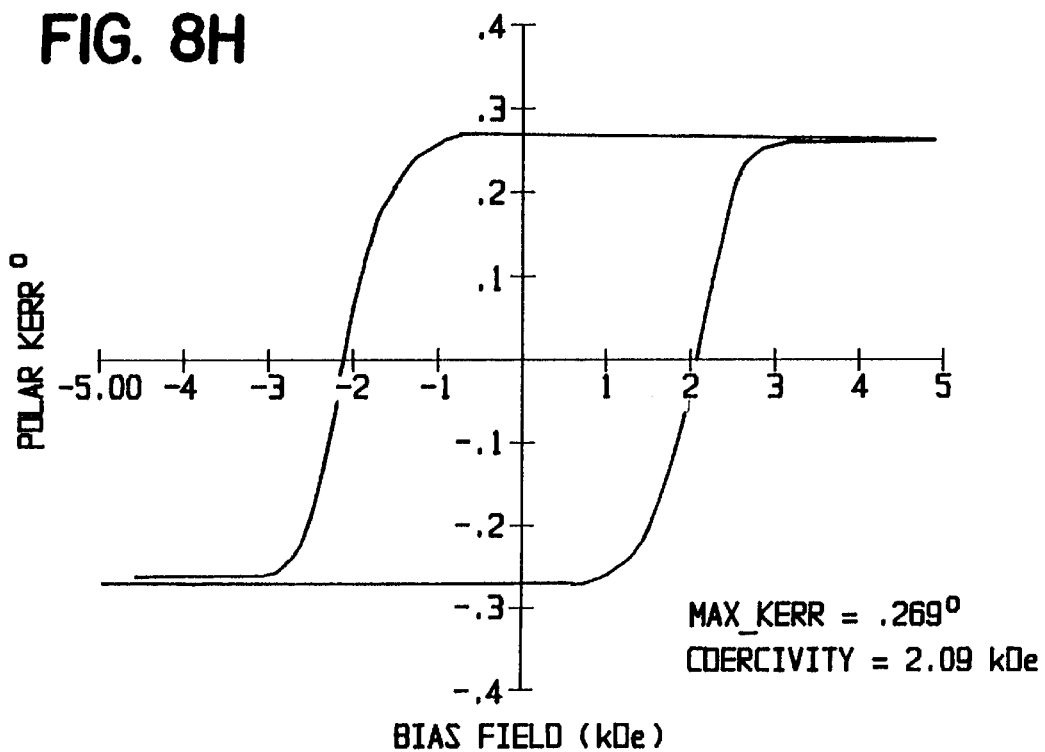
Figure 8I:
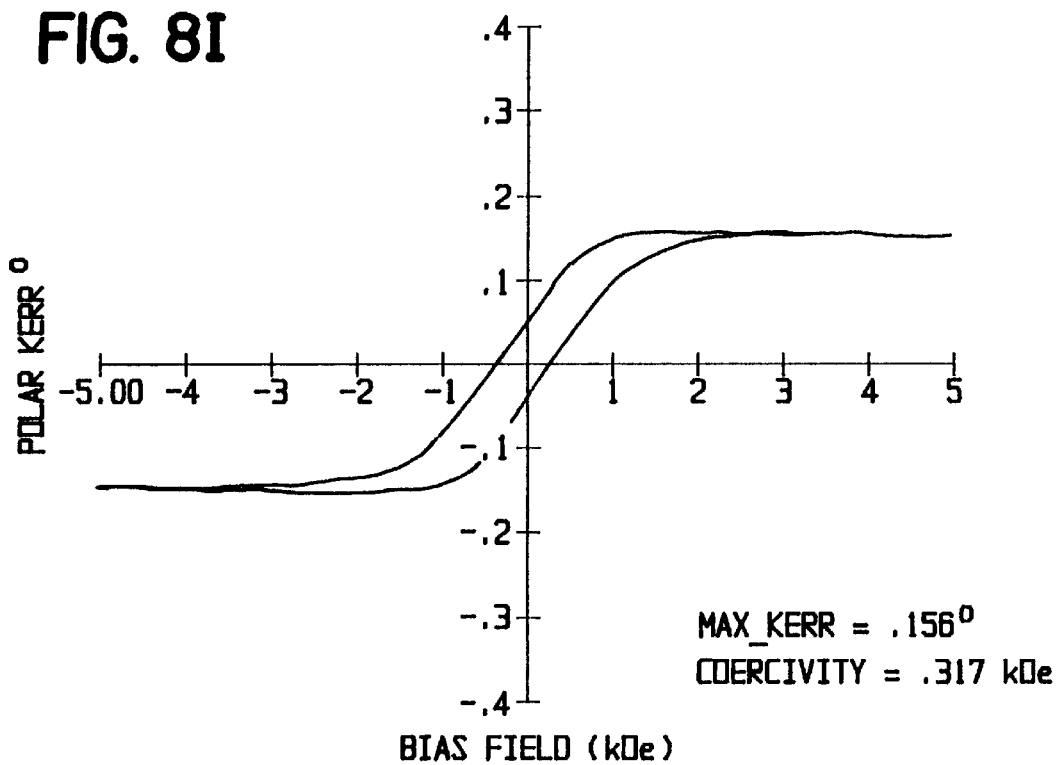
Figure 8J:
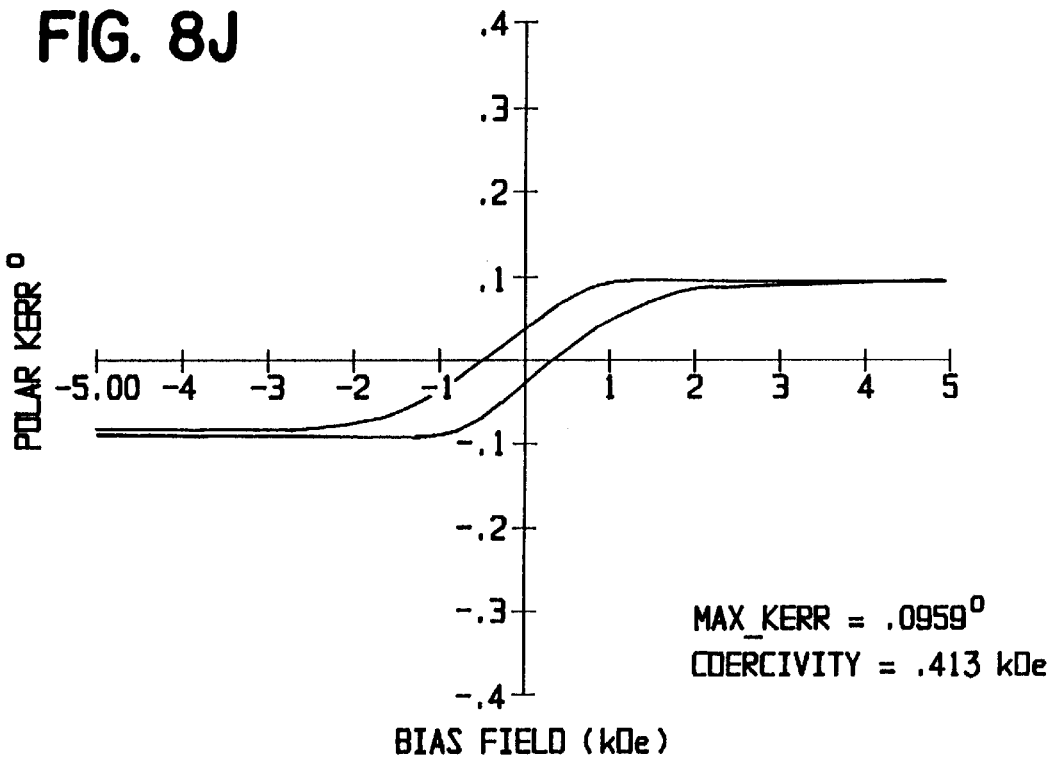
Figure 8K:
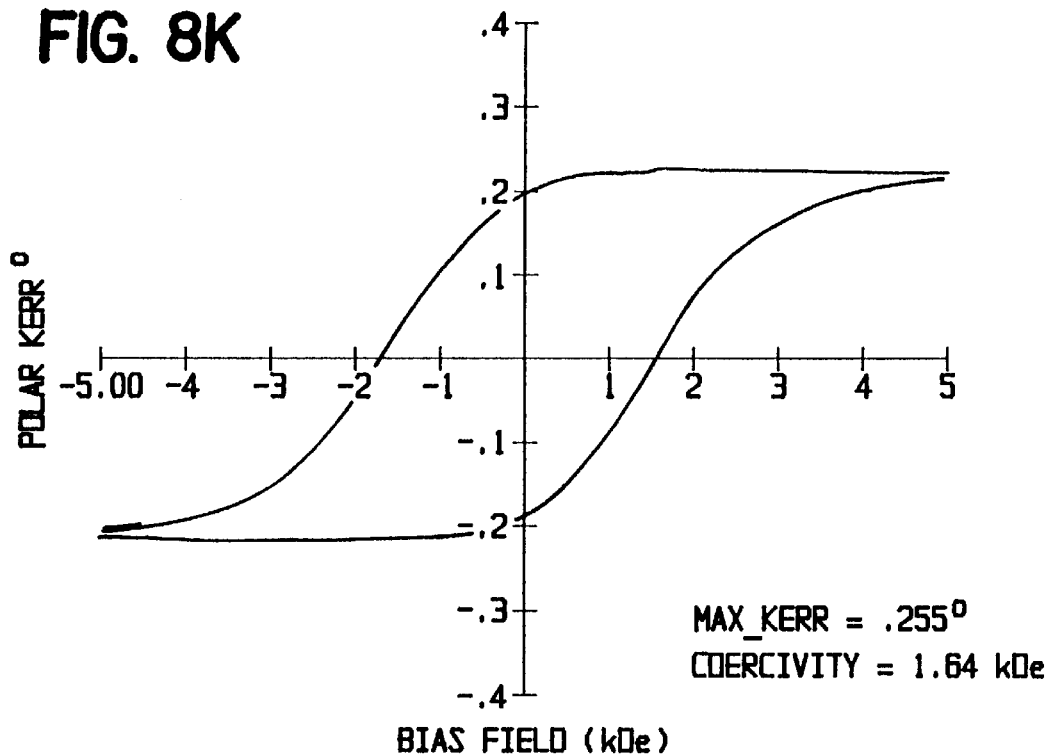
Figure 8L:
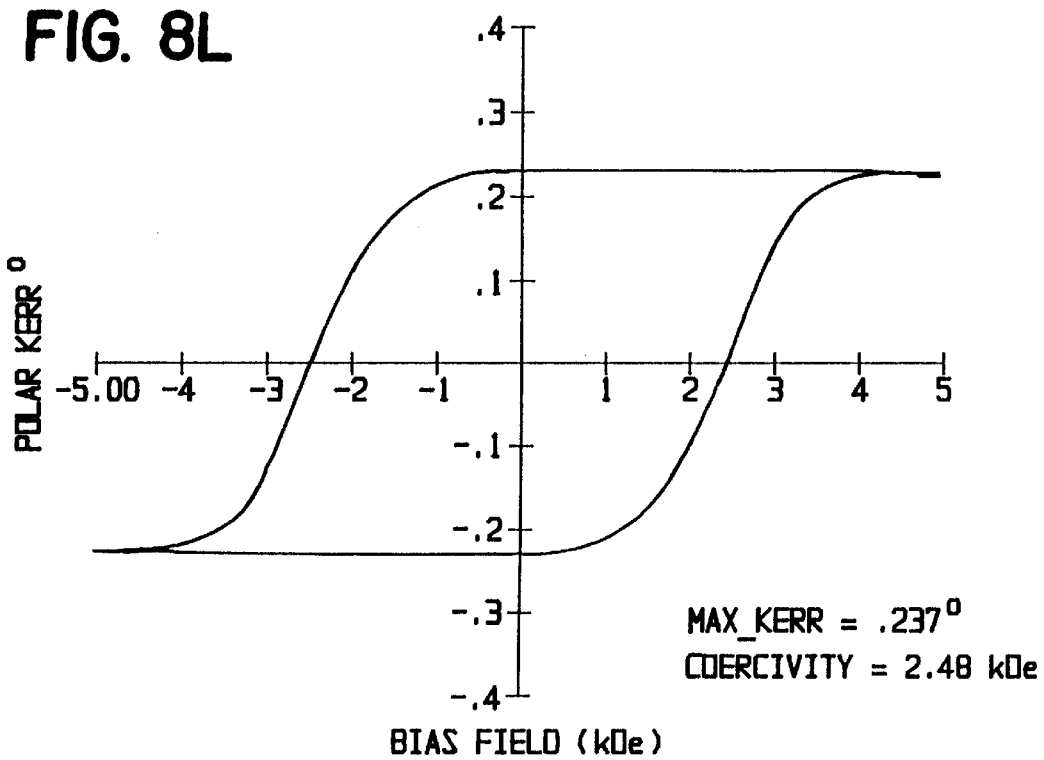

The glass substrate with the deposited multilayer was removed from the sputtering chamber. The polar Kerr loop for this sample is shown in FIG. 13.

EXAMPLE 15

The procedure of Example 14 was followed with the following adjustments:

In the "Interlayer Deposition" stage approximately 50 Å thick Pt or Pd or Co or Ag or Au interlayers were deposited in a manner to that described for the Pt interlayer illustrated in previous Examples with suitable adjustment of power applied to the sputtering target, number of target passes and speed of substrate table rotation to achieve an interlayer thickness of 50 Å.

The properties obtained were as follows:

| Interlayer | Pt | Pd | Co | Ag | Au |
| --- | --- | --- | --- | --- | --- |
| $H_c$ (kOe) | 2.46 | 1.64 | 1.03 | 3.25 | 2.42 |
| $\theta_k$ (°) | 0.06 | 0.05 | 0.14 | −0.01 | 0.02 |

The sample having the Pt interlayer was attached to an Al block which was then heated by halogen light bulbs. The sample was heated in stepwise manner, from 19° C. to 83° C. to 120° C. to 150° C. After each step the sample was allowed to settle for 3 minutes; after the final heat step it was allowed to settle for 13 minutes. The sample was then cooled, using forced air cooling, to 22° C. in 12 minutes.

After the thermal treatment, $H_c$ and $\theta_k$ were as follows:

| $H_c$ (kOe) | 3.27 |
| --- | --- |
| $\theta_k$ (°) | 0.05 |

We claim:

1. A sputtered Pt/Co multilayer film materials system having a polar Kerr rotation of 0.1 or more, a square polar Kerr hysteresis loop, and a room temperature coercivity in excess of 2000 Oe up to 7.31 kOe, comprising a substrate material, a metal interlayer of Pt of as-deposited thickness up to 16 Å, and an alternating Pt-Co multilayer.

2. A sputtered Pt/Co multilayer film materials system according to claim 1 wherein the metal interlayer as-deposited thickness is from 8–16 Å.

3. A sputtered Pt/Co multilayer film materials system according to claim 1 wherein the metal interlayer as deposited thickness is 8 Å.

4. A sputtered Pt/Co multilayer film materials system according to claim 1 wherein the metal interlayer as-deposited thickness is 16 Å.

5. A sputtered Pt/Co multilayer film materials system according to claim 1 wherein the substrate material comprises glass.

6. A sputtered Pt/Co multilayer film materials system according to claim 1 wherein the substrate material has deposited thereon a layer of optical enhancing material comprising silicon or silicon nitride.

7. A sputtered Pt/Co multilayer film materials system according to claim 1 wherein the substrate material has deposited thereon an optical enhancing material comprising silicon or silicon nitride.

8. A sputtered Pt/Co multilayer film materials system according to claim 1 wherein each cobalt layer has a thickness of up to 12 Å and each platinum layer has a thickness of up to 24 Å.

9. A sputtered Pt/Co multilayer film materials system according to claim 1 wherein each cobalt layer has a thickness of 2–5 Å and each platinum layer has a thickness of 6–15 Å.

10. A sputtered Pt/Co multilayer film materials system according to claim 1 wherein the total multilayer film has a thickness of less than 500 Å.

11. A magneto-optic disc comprising the sputtered multilayer film of claim 1.

12. The sputtered Pt/Co multilayer film material system according to claim 1 wherein said room temperature coercivity is 2790 Oe.

* * * * *